United States Patent
Terai

(10) Patent No.: US 7,791,129 B2
(45) Date of Patent: Sep. 7, 2010

(54) SEMICONDUCTOR DEVICE AND METHOD OF PRODUCING THE SAME INCLUDING A CHARGE ACCUMULATION LAYER WITH DIFFERING CHARGE TRAP SURFACE DENSITY

(75) Inventor: Masayuki Terai, Tokyo (JP)

(73) Assignee: NEC Corporation, Tokyo (JP)

( * ) Notice: Subject to any disclaimer, the term of this patent is extended or adjusted under 35 U.S.C. 154(b) by 70 days.

(21) Appl. No.: 12/162,224

(22) PCT Filed: Jan. 18, 2007

(86) PCT No.: PCT/JP2007/050688

§ 371 (c)(1), (2), (4) Date: Jul. 25, 2008

(87) PCT Pub. No.: WO2007/086304

PCT Pub. Date: Aug. 2, 2007

(65) Prior Publication Data

US 2009/0050983 A1 Feb. 26, 2009

(30) Foreign Application Priority Data

Jan. 25, 2006 (JP) .............................. 2006-015866

(51) Int. Cl.
- H01L 21/8238 (2006.01)
- H01L 21/336 (2006.01)
- H01L 29/76 (2006.01)
- H01L 29/94 (2006.01)
- H01L 31/062 (2006.01)
- H01L 31/113 (2006.01)
- H01L 31/119 (2006.01)

(52) U.S. Cl. .................. 257/323; 257/411; 438/216; 438/287

(58) Field of Classification Search ............ 257/323, 257/411, E21.409, E47.001; 438/216, 287
See application file for complete search history.

(56) References Cited

U.S. PATENT DOCUMENTS

| 6,818,944 | B2 * | 11/2004 | Lee ............................ 257/324 |
| 7,217,972 | B2 * | 5/2007 | Mori .......................... 257/315 |
| 7,598,589 | B2 * | 10/2009 | Takahashi et al. ........... 257/501 |
| 2008/0003747 | A1 * | 1/2008 | Choi .......................... 438/258 |

FOREIGN PATENT DOCUMENTS

| JP | 2003-60096 A | 2/2003 |
| JP | 2003-318290 A | 11/2003 |
| JP | 2004-111629 A | 4/2004 |
| JP | 2004-152954 A | 5/2004 |
| JP | 2004-296683 A | 10/2004 |
| JP | 2005-26300 A | 1/2005 |
| JP | 2005-294498 A | 10/2005 |

* cited by examiner

Primary Examiner—William M. Brewster
(74) Attorney, Agent, or Firm—Sughrue Mion, PLLC

(57) ABSTRACT

There is provided a trap memory device suppresses electric charges from flowing from the outside into a charge accumulation region and accumulated electric charges from diffusing to the outside or flowing out due to a defect. A gate conductor 6 is formed through a laminate insulating film including a first gate insulating film 3, a charge accumulation layer 4 and a second gate insulating film 5 on a silicon substrate 1. The laminate insulating film (3 to 5) projects outside the gate conductor 6 and extends to under the outer end of a side wall 8. The charge accumulation layer 4 includes a high trap surface-density region 4a immediately under the gate conductor and a low trap surface-density region 4b outside the gate conductor.

26 Claims, 21 Drawing Sheets

F I G. 1
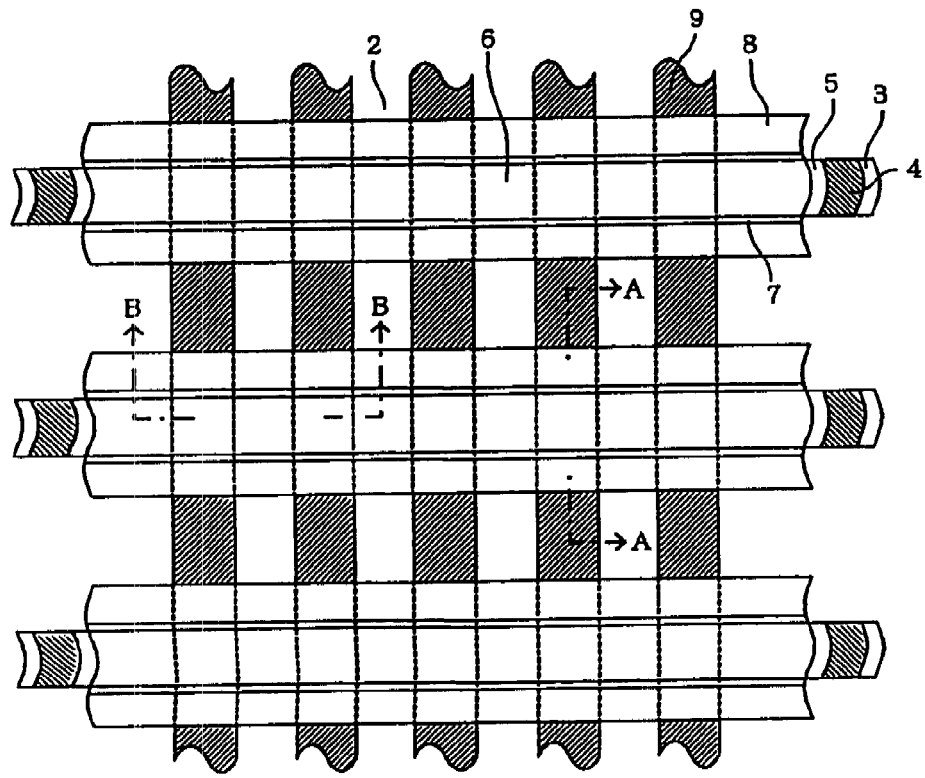
F I G. 2
(a) CROSS SECTION TAKEN ALONG LINE A-A
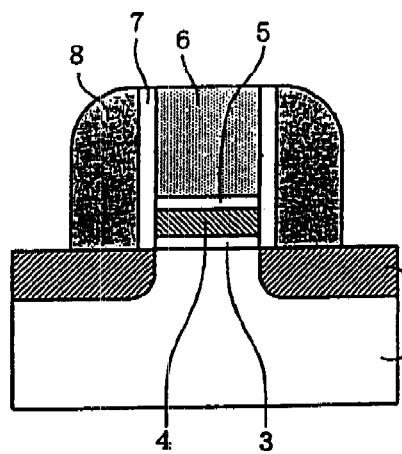
(b) CROSS SECTION TAKEN ALONG LINE B-B
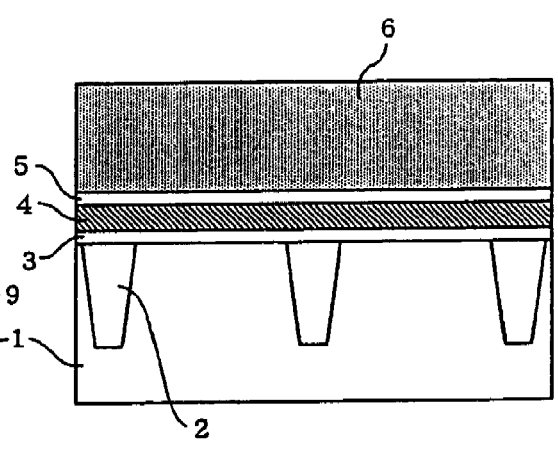

(a) CROSS SECTION TAKEN ALONG LINE A-A (b) CROSS SECTION TAKEN ALONG LINE B-B (a)

(b)

(c)

(d)

(a) CROSS SECTION TAKEN ALONG LINE A-A (b) CROSS SECTION TAKEN ALONG LINE B-B (a) CROSS SECTION TAKEN ALONG LINE A-A (b) CROSS SECTION TAKEN ALONG LINE B-B (a) CROSS SECTION TAKEN ALONG LINE A-A (b) CROSS SECTION TAKEN ALONG LINE B-B (a) CROSS SECTION TAKEN ALONG LINE A-A (b) CROSS SECTION TAKEN ALONG LINE B-B (a) CROSS SECTION TAKEN ALONG LINE A-A (b) CROSS SECTION TAKEN ALONG LINE B-B (a) CROSS SECTION TAKEN ALONG LINE A-A (b) CROSS SECTION TAKEN ALONG LINE B-B (a)

(b)

(a)

(b)

(a) CROSS SECTION TAKEN ALONG LINE A-A (b) CROSS SECTION TAKEN ALONG LINE B-B

SEMICONDUCTOR DEVICE AND METHOD OF PRODUCING THE SAME INCLUDING A CHARGE ACCUMULATION LAYER WITH DIFFERING CHARGE TRAP SURFACE DENSITY

TECHNICAL FIELD

The present invention relates to a semiconductor device and a method of producing the same, and in particular, to a semiconductor device including a rewritable nonvolatile semiconductor memory typified by a flash memory and a method of producing the same.

BACKGROUND ART

LSIs including a flash memory continue to be miniaturized, and are entering the 65 nm era from the current 0.13 μm and 90 nm nodes era. Therefore, although the flash memory has mainly used a floating gate (FG) memory cell up to the 0.13 μm node era to meet requirements for reducing a cell area and thinning an insulation film, attention has been paid to a trap memory which uses traps discretely included in an insulating film to capture electric charges because it has been found that thinning the insulating film will be difficult in view of securement of retention property in the 90 nm node era or later. In comparison with the FG memory, the trap memory has the advantage that an effective oxide thickness can be reduced, including the reduction of a tunnel oxide film thickness, and it has a simpler device structure. The locality of an electric charge can be used to achieve a state in which two or more bits are written for one cell, and is also advantageous to reduce a cell area per one bit.

FIG. 1 is a top view of a conventional trap memory. FIGS. 2(a) and 2(b) are cross sections taken along lines A-A and B-B in FIG. 1. As illustrated in FIGS. 1 and 2, a plurality of element isolation insulating films 2 which segments an active region extends in the upper and the lower direction in FIG. 1 in a pattern of lines and spaces in the surface region of a silicon substrate 1. A laminate insulating film composed of a first gate insulating film 3, a charge accumulation layer 4 and a second gate insulating film 5 is formed over the silicon substrate 1. The predetermined number of gate conductors 6 are formed in a pattern of lines and spaces so as to be orthogonal to the active region (i.e. to be orthogonal to the element isolation insulating films 2) over the laminate insulating film. Gate side walls 7 of an insulating material are formed on the sides of the gate conductor 6. Side walls 8 of an insulating material are formed outside the gate side walls 7. The first gate insulating film 3, the charge accumulation layer 4, and the second gate insulating film 5 are patterned self-alignedly with the gate conductor 6 and the charge accumulation layer 4 does not exist outside the gate conductor 6. Hereinafter, such structured trap memory is referred to as a first conventional example.

FIG. 3 illustrates a method of producing the first example of the conventional trap memory in FIG. 1 and are cross sections taken along lines A-A in FIG. 1 according to the order of processes. As illustrated in FIG. 3(a), the first gate insulating film 3, the charge accumulation layer 4, the second gate insulating film 5 and a silicon film 6a are sequentially deposited over the silicon substrate 1 on which the element isolation insulating film (not shown) is formed. Thereafter, as illustrated in FIG. 3(b), the silicon film 6a is patterned using lithography technique and dry etching technique to form the linear gate conductor 6. The exposed first gate insulating film 3, charge accumulation layer 4 and second gate insulating film 5 are removed by etching using the patterned gate conductor 6 as a mask. As illustrated in FIG. 3(c), an insulating film is deposited and etched back to form the gate side wall 7. Then, an impurity diffusion layer 9 functioning as a source and a drain region is formed. Finally, as illustrated in FIG. 3(d), an insulating film is deposited and etched back to form the side wall 8. Thus, the first example of the conventional trap memory can be formed.

The first example of the conventional trap memory has a significant problem as described below. The problem will be described using an enlarged view of the drain end and its vicinity in FIG. 4. The trap memory performs writing such that a positive voltage is applied to the drain region (the impurity diffusion layer 9) and the gate conductor 6 to inject channel hot electrons (CHE) into the charge accumulation layer 4 near the drain end. A distribution 11 in FIG. 28 represents the distribution of electrons provided by injecting CHEs. At this point, the portion of broken line of the distribution 11 corresponding to a part of the injected electrons deviates from a charge accumulation region composed of the laminate insulating film (3, 4 and 5), so that charges are not accumulated in the charge accumulation layer 4 and escape to the electrode or the substrate. This reduces efficiency in writing the injected electrons to increase the writing time.

In the above conventional structure, a defect is generated in the insulating films at the gate end portion during the etching process for the second gate insulating film 5, the charge accumulation layer 4 and the first gate insulating film 3 illustrated in FIG. 3(b). The defect remains at the gate end portion even after the gate side wall 7 has been formed to increase a leak current through the defect and cause leakage of the accumulated charge, resulting in decrease in yield. When the gate side wall 7 is formed by the thermal oxidation of the gate conductors 6, the laminate insulating film (3, 4 and 5) at the gate end portion is simultaneously oxidized and part of the aforementioned defect is recovered. However, a bird's beak is formed on the substrate at the gate end portion by the thermal oxidation to increase the defect density of the first gate insulating film near the gate end, lowering the yield.

In order to avoid the problem of the first example of the conventional trap memory, Patent Document 1 proposes a structure in which the charge accumulation layer 4 is projected from the gate conductors 6. FIG. 5 is a top view of the trap memory disclosed in Patent Document 1. FIGS. 6(a) and 6(b) are cross sections taken along lines A-A and B-B in FIG. 5. In FIGS. 5 and 6, the same portions as those in the first example illustrated in FIGS. 1 and 2 are denoted by the same reference numerals and the duplicated description is omitted. In the present conventional example, the laminate insulating film (3 to 5) including the charge accumulation layer 4 is projected from the end of the gate conductors 6. Hereinafter, this structure is referred to as a second conventional example.

A method of producing the second example of the conventional trap memory is described below with reference to FIG. 7. FIG. 7 are cross sections illustrating the method of producing the second conventional example according to the order of processes. As illustrated in FIG. 7(a), the first gate insulating film 3, the charge accumulation layer 4, the second gate insulating film 5 and a silicon film 6a for forming a gate electrode are sequentially deposited over the silicon substrate 1. As illustrated in FIG. 7(b), the silicon film 6a is patterned using dry etching technique to form the gate conductor 6. At this point, etching is stopped at the second gate insulating film 5. After that, as illustrated in FIG. 7(c), the gate side wall 7 is formed on the surface of the gate conductor 6 by thermal oxidation. Furthermore, ions are implanted using the gate conductor and the gate side wall 7 as masks to form the impurity diffusion layer 9 functioning as a source and a drain region. As illustrated in FIG. 7(d), an insulating film is deposited and etched back to form the side wall 8. Finally, the exposed second gate insulating film 5, charge accumulation layer 4 and first gate insulating film 3 are removed by etching using the gate conductor 6 and the side wall 8 as masks.

The second conventional example can solve the problems with the first conventional example. FIG. 8 is an enlarged view illustrating the vicinity of the drain region of the second conventional example. For the present conventional example, the charge accumulation layer 4 extends outside the gate side wall 7, so that the electrons in the distribution 11 of injected CHEs are effectively accumulated in the charge accumulation layer 4 to improve efficiency in writing the injected CHEs. Furthermore, dry etching does not damage the laminate insulating film (3 to 5) at the gate end to prevent accumulated charges from leaking into the substrate and electrodes. Patent Document 1: Japanese Patent Laid Open Publication No. 2003-60096

DISCLOSURE OF INVENTION

Problem to be Solved by the Invention

However, the improved second conventional example still has the following problem. As illustrated in FIG. 8, the accumulated charges written along with the electron distribution 11 diffuse outside the gate, which makes it difficult to completely erase the accumulated charges. As illustrated in FIG. 7(c), since the impurity diffusion layer 9 is formed by ion implantation through the laminate insulating film (3 to 5), implantation defects are produced at the insulating film portion exposed from the gate electrode to cause the accumulated charges to leak through the defects, deteriorating the retention property. In addition, charge-up neutralizing electrons injected at the time of ion implantation diffuse through the exposed portion of the charge accumulation layer 4 and flow into the charge accumulation layer 4 to increase an initial threshold value VT and degrade uniformity.

The present invention aims to solve the problems with the above related art and has for its object to provide a trap memory which is low and uniform in an initial threshold value VT and excellent in writing, erasing and retaining properties.

Means for Solving the Problems

To achieve the above object, the present invention provides a semiconductor device including a plurality of nonvolatile memory cells including a laminate insulating film and a first gate electrode formed on the laminate insulating film, the laminate insulating film including a first gate insulating film, a charge accumulation layer and a second gate insulating film which are formed on and in this order from a semiconductor substrate on which a source and a drain region are formed, wherein the laminate insulating film is projected outward from an end of the first gate electrode and the electric charge trap surface-density of the charge accumulation layer outside the end of the gate electrode is lower than that in the region inside the first gate electrode.

To achieve the above object, the present invention provides a semiconductor device comprising a plurality of nonvolatile memory cells including a first gate electrode and a laminate insulating film, the first gate electrode provided with a gate side wall formed on the side of the first gate electrode, and the laminate insulating film including an underlying oxide film formed of a silicon oxide film or silicon oxynitride film formed on a semiconductor substrate on which a source and a drain region are formed, an upper oxide film formed of a silicon oxide film or silicon oxynitride film formed under and in contact with the lower surface of the first gate electrode and a silicon nitride film formed between the underlying oxide film and the upper oxide film; wherein, the laminate insulating film is projected outward from an end of the first gate electrode and the silicon nitride film outside the end of the first gate electrode is thinner than a region inside the first gate electrode, or the silicon nitride film includes a region where the thickness thereof is continuously or stepwise reduced outside the end of the first gate electrode, or the silicon nitride film does not exist outside the first gate electrode or the gate side wall, or the thickness of the upper oxide film outside the first gate electrode or the gate side wall is thicker than that of the upper oxide film immediately beneath the first gate electrode.

To achieve the above object, the present invention provides a method of producing a semiconductor device including a plurality of nonvolatile memory cells including a laminate insulating film and a first gate electrode formed on the laminate insulating film, the laminate insulating film including a first gate insulating film, a charge accumulation layer and a second gate insulating film which are formed on and in this order from a semiconductor substrate on which a source and a drain region are formed, the method comprising the steps of: forming the first gate insulating film on the semiconductor substrate; forming the charge accumulation layer on the first gate insulating film; forming the second gate insulating film on the charge accumulation layer; forming a silicon film on the second gate insulating film; forming the first gate electrode by patterning the silicon film; forming a gate side wall on the side of the first gate electrode; and changing a part of the charge accumulation layer outside the end of the first gate electrode to a film which is smaller in an electric charge trap surface-density than the original charge accumulation layer.

To achieve the above object, the present invention provides a method of producing a semiconductor device including a plurality of nonvolatile memory cells including a laminate insulating film and a first gate electrode formed on the laminate insulating film, the laminate insulating film including a first gate insulating film, a charge accumulation layer and a second gate insulating film which are formed on and in this order from a semiconductor substrate on which a source and a drain region are formed, the method comprising the steps of: forming the first gate insulating film on the semiconductor substrate; forming the charge accumulation layer on the first gate insulating film; forming the second gate insulating film on the charge accumulation layer; forming a silicon film on the second gate insulating film; forming the first gate electrode by patterning the silicon film; forming a gate side wall on the side of the first gate electrode; and changing a part of the charge accumulation layer exposed from the first gate electrode and the gate side wall and a part thereof under the gate side wall to a film which is smaller in an electric charge trap density than the original charge accumulation layer.

To achieve the above object, the present invention provides a method of producing a semiconductor device including a plurality of nonvolatile memory cells including a laminate insulating film and a first gate electrode formed on the laminate insulating film, the laminate insulating film including a first gate insulating film, a charge accumulation layer and a second gate insulating film which are formed on and in this order from a semiconductor substrate on which a source and a drain region are formed, the method comprising the steps of: forming the first gate insulating film on the semiconductor substrate; forming the charge accumulation layer on the first gate insulating film; forming the second gate insulating film on the charge accumulation layer; forming a silicon film on the second gate insulating film; forming the first gate electrode by patterning the silicon film; and forming a gate side wall on the side of the first gate electrode; wherein a part of the charge accumulation layer exposed from the first gate electrode and the gate side wall and a part thereof under the gate side wall are oxidized to be changed to an oxide silicon film or a high oxygen-content film.

To achieve the above object, the present invention provides a method of producing a semiconductor device including a plurality of nonvolatile memory cells including a laminate insulating film and a first gate electrode formed on the laminate insulating film, the laminate insulating film including a first gate insulating film, a charge accumulation layer and a second gate insulating film which are formed on and in this order from a semiconductor substrate on which a source and a drain region are formed, the method comprising the steps of: forming the first gate insulating film on the semiconductor substrate; forming the charge accumulation layer on the first gate insulating film; forming the second gate insulating film on the charge accumulation layer; forming a silicon film on the second gate insulating film; and forming the first gate electrode by patterning the silicon film; wherein, a part of the charge accumulation layer exposed from the first gate electrode is oxidized to change at least a part of it to an oxide silicon film and the side wall of the first gate electrode is oxidized to form a gate side wall.

EFFECT OF THE INVENTION

In the trap memory of the present invention, the electric charge trap immediately below the gate electrode is rendered higher in surface density than that outside the gate electrode, so that the electric charge trap immediately below the gate electrode accumulates more electric charges at the time of writing by injecting CHE to improve writing and erasing properties. The electric charges accumulated below the gate electrode are suppressed to diffuse into regions outside the gate electrode to improve the retention property. Moreover, electrons to be injected for neutralization at the time of ion implantation to form the source and the drain region are suppressed to diffuse below the gate electrode, which does not increases the initial threshold value VT and suppresses the dispersion thereof.

BEST MODE FOR CARRYING OUT THE INVENTION

A desirable embodiment of the present invention is described below in detail with reference to the accompanied drawings.

First Exemplary Embodiment

FIG. 9 is a top view of a trap memory according to the first exemplary embodiment of the present invention. FIGS. 10(a) and 10(b) are cross sections taken along lines A-A and B-B in FIG. 9. As illustrated in FIGS. 9 and 10, a plurality of element isolation insulating films 2 which segments an active region are formed in the surface region of a silicon substrate 1 so as to extend in the upper and the lower direction in FIG. 9. A laminate insulating film composed of a first gate insulating film 3, a charge accumulation layer 4 and a second gate insulating film 5 is formed over the silicon substrate 1. The predetermined number of gate conductors 6 are formed so as to be orthogonal to the active region (i.e. to be orthogonal to the element isolation insulating films 2) over the laminate insulating film. Gate side walls 7 are formed on both sides of the gate conductor 6. Side walls 8 are formed outside the gate side walls 7. An impurity diffusion layer 9 forming a source and a drain region is formed in the active region of the silicon substrate 1. The laminate insulating film composed of the first gate insulating film 3, the charge accumulation layer 4 and the second gate insulating film 5 is projected from the gate conductor 6 and reaches beneath the outer end of the side wall 8.

In the present embodiment, the charge accumulation layer 4 includes a high trap surface-density region 4a immediately under the gate conductor 6 and a low trap surface-density region 4b extending outside of the gate conductor 6. The low trap surface-density region 4b is lower in trap surface-density than the high trap surface-density region 4a and includes a region or a case where a trap surface-density is zero. The boundary between the high and the low trap surface-density region 4a and 4b desirably exists at the end of the gate conductor 6 or at the lower portion of the gate side wall 7. The electric charge trap surface-density is controlled by varying an electron trap density per unit volume of the charge accumulation layer or the thickness of the charge accumulation layer containing a high-density electron traps. In FIGS. 9 and 10, an electron trap density per unit volume in the low trap surface-density region 4b is rendered lower than that in the high trap surface-density region 4a.

A production method according to the first exemplary embodiment of the present invention is described below. FIG. 11 is cross sections taken along line A-A in FIG. 9 and illustrated according to the order of processes.

As illustrated in FIG. 11(a), the surface of the silicon substrate 1 on which an element isolation insulating film (riot shown) is formed is oxidized in an atmosphere of oxygen diluted by nitrogen to form the first gate insulating film 3 of a silicon oxide film. A silicon nitride film for forming the charge accumulation layer 4 is deposited on the first gate insulating film 3 using a chemical vapor deposition (CVF)) method. The upper portion of the silicon nitride film is oxidized by In Situ Steam Generation (ISSG) to form a silicon oxide film functioning as the second gate insulating film 5. At this point, a silicon nitride film remained without being oxidized acts as the charge accumulation layer 4. A phosphorus-added silicon film 6a is deposited on the second gate insulating film 5 using the CVD method.

As illustrated in FIG. 11(b), the silicon film 6a is patterned to form the gate conductor 6. An anti-reflection coating and a resist film are deposited on the silicon film 6a, exposed and developed to pattern the resist film in the gate shape. After that, the silicon film 6a is etched with a dry etcher to form the gate conductor 6. Etching is desirably stopped when an unnecessary silicon film 6a excluding the gate portion has been completely etched so as to minimize damage to the silicon oxide film (the second gate insulating film 5).

As illustrated in FIG. 11(c), the electron trap surface-density of the portion of the charge accumulation layer 4 exposed from the gate electrode is decreased. An annealing process is performed in the state that a part of the charge accumulation layer 4 is exposed from the gate electrode to decrease the trap density of the exposed part. When the charge accumulation layer is decreased in thickness, the upper layer of the charge accumulation layer is oxidized in an atmosphere containing $O_2$, $H_2O$, NO, $N_2O$ or oxygen radical. Thus, a high electron trap surface-density region 4a and a low electron trap surface-density regions 4b of which border is on the ends of the gate electrode are formed. According to this method, even if the low electron trap surface-density region 4b is changed to a silicon oxide film which does not contain traps, the defect of the charge accumulation layer is not produced at the end of the gate, unlike a conventional method in which the charge accumulation layer exposed from the gate electrode is completely removed by dry etching, allowing forming a good boundary of the high electron trap surface-density region 4a. Consequently, the retention property of the present embodiment is improved as compared with that of the first conventional example.

As illustrated in FIG. 11(d), a silicon nitride film is deposited on the entire surface of the substrate and etched back to form the gate side wall 7. As illustrated in FIG. 11(e), ions are implanted self-alignedly with the gate conductor 6, and thereafter, an activation process is performed to form an impurity diffusion layer 9 functioning as a source and a drain region.

As illustrated in FIG. 11(f), a non-doped silicate glass (NGS) film is deposited on the entire surface and etched back to form the side wall 8. Furthermore, the second gate insulating film 5, the low trap surface-density region 4b of the charge accumulation layer 4 and the first gate insulating film 3 are removed by etching self-alignedly with the side wall. Thus, the semiconductor device according to the first exemplary embodiment of the present invention can be formed.

FIG. 12 is a schematic diagram illustrating an electron trap density and accumulated charge distribution at the time of writing in the vicinity of the drain of the trap memory cell according to the present invention. A vacant electron trap and an electron trap capturing an electron are illustrated by a blank and a shaded square respectively. The application of a positive high voltage to the gate and the drain generates channel hot electrons (CHE) to inject the electrons into the charge accumulation layer 4 as shown by the distribution 11. In this case, when the electrons are injected into the region where vacant traps exist, the electrons are captured. When the electrons are injected into the region where no vacant trap exists, the injected electrons escape to the gate electrode or diffuse sideways in the charge accumulation layer and captured by vacant traps. The electrons in the charge accumulation layer 4 easily diffuse in the high electron trap surface-density region 4a, but hardly diffuse in the low electron trap surface-density region 4b. When an electric charge trap surface-density is $10^{11}$ cm$^{-2}$ or less in particular, the trapped electrons hardly diffuse into the charge accumulation layer. Consequently, the present invention allows suppressing the diffusion of overflowing electrons toward the outside of the gate electrode and the capture thereof at the outside region, and incomplete erasure resulting therefrom.

Furthermore, the distribution of the injected electrons concentrates on the vicinity of gate electrode end, so that a writing efficiency of electric charges can be improved by setting the boundary between the high electron trap surface-density region 4a and the low electron trap surface-density region 4b to the gate electrode end or the lower portion of the gate side wall and the abovementioned incomplete erasure can be effectively suppressed.

FIGS. 13(a) and 13(b) are schematic diagrams illustrating additional factors behind the inflow of electric charges into the charge accumulation layer at the production process and the outflow of accumulated electric charges due to writing. As illustrated in FIG. 13(a), at the time of high current ion implantation, part of charge-up neutralizing electron beams flows into the laminate insulating film (3 to 5) and is accumulated in the charge accumulation layer 4. The inflow electric charges diffuse into the high trap surface-density region 4a under the gate electrode at the heat treatment process to increase the initial threshold value VT. Ion implantation damage is formed in the low trap surface-density region 4b where the charge accumulation layer 4 is exposed from the gate electrode. When the charge accumulation layer 4 exposed from the gate electrode is in the high trap surface-density region 4a, electric charges more easily diffuse because the electric charges pass through the ion implantation damage. In FIG. 13, blank arrows represent the easiness of diffusion of captured electron. The memory cell structure according to the present invention allows suppressing increase in the initial threshold value VT due to inflow of electrons from the outside of the gate electrode by lowering the electron trap surface-density outside the gate electrode end to suppress the sideway diffusion of electric charges, as compared with the second conventional example where the high electron trap surface-density region is exposed on the entire surface.

When the charge accumulation layer 4 exposed from the gate electrode is in the high trap surface-density region, the accumulated electric charges written in the charge accumulation layer 4 pass through the damage introduced at the time of ion implantation to more easily flow out, degrading the retention property. The memory cell structure, according to the present invention, in which the electron trap surface-density outside the gate electrode end is lowered suppresses the sideway diffusion of electric charges to improve the outflow of electric charges through an ion implantation defect.

Example 1

FIG. 14 is a top view of an example 1 of the present invention. FIGS. 15(a) and 15(b) are cross sections taken along lines A-A and B-B in FIG. 14. In FIGS. 14 and 15, the same portions as those in the first exemplary embodiment illustrated in FIGS. 9 and 10 are denoted by the same reference numerals as those in FIGS. 9 and 10 and the duplicated description thereof is omitted. In the present example, the portion of the charge accumulation layer 4 immediately under the gate conductor 6 is rendered the high trap surface-density region 4a, part of the outside portion of the gate conductor is rendered the low trap surface-density region 4b which is lower in trap surface-density than the high trap surface-density region 4a and the portion outside the part is rendered a non-trap region 4c which does not contain electric charge traps. The non-trap region 4c does not contain nitrogen and is almost completely converted to a silicon oxide film. In the memory cell of the example 1, electron traps are eliminated from the charge accumulation layer 4 in the vicinity of the end of the side wall 8 so that the inflow of electric charges from the outside can be more effectively suppressed.

Example 2

FIG. 16 is a top view of an example 2 of the present invention. FIGS. 17(a) and 17(b) are cross sections taken along lines A-A and B-B in FIG. 16. In FIGS. 16 and 17, the same portions as those in the first exemplary embodiment illustrated in FIGS. 9 and 10 are denoted by the same reference numerals as those in FIGS. 9 and 10 and the duplicated description thereof is omitted. In the present example, the portion of the charge accumulation layer 4 immediately under the gate conductor 6 is rendered the high trap surface-density region 4a and the portion outside the end of the gate conductor is rendered the non-trap region 4c which does not contain electric charge traps. The non-trap region 4c outside the end of the gate conductor does not contain nitrogen and is almost completely converted to a silicon oxide film. In the memory cell of the example 2, electric charge traps do not exist at the portion outside the gate conductor. The charge accumulation layer 4 inside the gate conductor 6 or inside the gate conductor 6 and the gate side wall 7 is rendered a region which is high in electric charge trap surface-density. The present example more surely suppresses the inflow of electrons from the outside and the diffusion of accumulated electric charges toward the outside of the gate.

Example 3

FIG. 18 is a top view of an example 3 of the present invention. FIGS. 19(a) and 19(b) are cross sections taken along lines A-A and B-B in FIG. 18. In FIGS. 18 and 19, the same portions as those in the first exemplary embodiment illustrated in FIGS. 9 and 10 are denoted by the same reference numerals as those in FIGS. 9 and 10 and the duplicated description thereof is omitted. In the present example, the region of the charge accumulation layer 4 immediately under the gate conductor 6 is rendered an initial film-thickness region 4d whose thickness remains unchanged, but the region of the charge accumulation layer 4 outside the gate conductor is rendered a thin-film region 4e whose thickness is smaller than the initial thickness. Part of the charge accumulation layer 4 is rendered the non-trap region 4c. In the present example, the charge accumulation layer (4e) containing electric charge traps outside the end of the gate electrode is rendered thinner than the charge accumulation layer (4d) inside the gate electrode so that the electric charge trap surface-density outside the gate electrode is made smaller than that inside the gate electrode, thereby allowing suppressing the inflow of electrons from the outside and the diffusion of accumulated electric charges toward the outside of the gate. In particular, the boundary at which the thickness of the charge accumulation layer 4 is changed is set to the end of the gate conductor 6 or the lower portion of the gate side wall 7 to provide a higher effect.

Example 4

FIG. 20 is a top view of an example 4 of the present invention. FIGS. 21(a) and 21(b) are cross sections taken along lines A-A and B-B in FIG. 20. In FIGS. 20 and 21, the same portions as those in the example 3 illustrated in FIGS. 18 and 19 are denoted by the same reference numerals as those in FIGS. 18 and 19 and the duplicated description thereof is omitted. The present example is different from the example 3 in that the thin-film region 4e of the charge accumulation layer 4 extends midway along the side wall 8 and does not reach the outer end of the side wall 8. The charge accumulation layer 4 outside the portion is rendered the non-trap region 4c across the entire thickness of the charge accumulation layer 4. The use of the structure of the example 4 eliminates electron traps at the end of the side wall to allow suppressing the inflow of electrons from the outside.

Example 5

FIG. 22 illustrates an example in which the memory cell structure of the present invention is applied to a split gate trap memory. In FIG. 22, the same portions as those in the first exemplary embodiment illustrated in FIGS. 9 and 10 are denoted by the same reference numerals as those in FIGS. 9 and 10 and the duplicated description thereof is omitted. In the present example, a control gate 14 is disposed through a laminate insulating film 15 on the channel side of the word gate 13 which is formed through a gate insulating film 16 on the silicon substrate 1. The first gate insulating film 3, the charge accumulation layer 4 and the second gate insulating film 5 are formed over the silicon substrate under the control gate 14. In the present example, the region of the charge accumulation layer 4 immediately under the control gate 14 is rendered the initial film-thickness region 4d whose thickness remains unchanged, but the region of the charge accumulation layer 4 outside the control gate 14 is rendered the thin-film region 4e and the non-trap region 4c. The formation of the charge accumulation layer allows improving a writing efficiency and lowering an incomplete erasure. An electric charge trap surface-density outside the gate side wall which is set to $10^{11}$ cm$^{-2}$ or less allows suppressing the inflow of electric charges from the outside of the end of the gate during the process and the outflow of accumulated electric charges and improving the uniformity of the initial threshold value VT and the retention property of the accumulated electric charges.

Second Exemplary Embodiment

FIG. 23 is a top view of a trap memory according to the second exemplary embodiment of the present invention. FIGS. 24(a) and 24(b) are cross sections taken along lines A-A and B-B in FIG. 23. FIG. 25 is an enlarged view of the vicinity of the drain region of the memory cell. As illustrated in FIGS. 23 and 24, a plurality of element isolation insulating films 2 which limits an active region extends in the upper and the lower direction in FIG. 23 in the surface region of a silicon substrate 1. A laminate insulating film composed of a first gate insulating film 3, a charge accumulation layer 4 and a second gate insulating film 5 is formed over the silicon substrate 1. The predetermined number of gate conductors 6 are formed so as to be orthogonal to the active region (i.e. to be orthogonal to the element isolation insulating films 2) over the laminate insulating film. Gate side walls 7 are formed on both sides of the gate conductor 6. Side walls 8 are formed outside the gate side walls 7. An impurity diffusion layer 9 forming a source and a drain region is formed in the active region of the silicon substrate 1. The laminate insulating film composed of the first gate insulating film 3, the charge accumulation layer 4 and the second gate insulating film 5 is projected from the gate conductor 6 and extends beneath the outer end of the side wall 8. As illustrated in FIGS. 24 and 25, the region of the charge accumulation layer 4 immediately under the gate conductor 6 is rendered an initial film-thickness region 4d whose thickness remains unchanged, but the region of the charge accumulation layer 4 outside the gate conductor is rendered a thin-film region 4e whose thickness is smaller than the initial thickness. The thickness of the charge accumulation layer containing high-density electric charge traps is continuously varied between the initial film-thickness region 4d and the thin-film region 4e. That is to say, the second exemplary embodiment is characterized by partly including a region where an electric charge trap surface-density is continuously lowered toward the outside of the gate between the region (4d) with a high electric charge trap surface-density and the region (4e) with a low electric charge trap surface-density. As illustrated in FIG. 25, a non-trap region 4c is formed thickly at the portion where the thin-film region 4e is formed in the charge accumulation layer 4. For this reason, the second gate insulating film 5 is raised in the region outside the gate conductor 6.

In FIGS. 23 and 24, although the thickness of the charge accumulation layer containing high-density electric charge traps is continuously reduced at the lower portion of the gate side wall to vary an electric charge trap surface-density, an electron trap density per unit volume may be continuously varied to form the same electron trap density distribution. Varying the electron trap density stepwise also brings about the same effect. The electron trap density outside the gate side wall is desirably $10^{11}$ cm$^{-2}$ or less.

As the first gate insulating film 3, there may preferably be used a silicon oxide film formed by thermally oxidizing the silicon substrate 1. As the charge accumulation layer 4, there may preferably be used a silicon nitride film. As the second gate insulating film 5, there may preferably be used a silicon oxide film. However, even using a silicon oxynitride film as the first and the second gate insulating film 3 and 5 allows achieving the same effect.

A production method according to the second exemplary embodiment of the present invention is described below with reference to FIG. 26. As illustrated in FIG. 26(a), the surface of the silicon substrate 1 with the element isolation insulating film 2 (not shown) is oxidized in an atmosphere of oxygen diluted by nitrogen to form a silicon oxide film functioning as the first gate insulating film 3. A silicon nitride film is deposited on the first gate insulating film 3 using a chemical vapor deposition (CVD) method. The upper portion of the silicon nitride film is oxidized by In Situ Steam Generation (ISSG) to leave the charge accumulation layer 4 on the first gate insulating film 3 and form a silicon oxide film functioning as the second gate insulating film 5. After that, a phosphorus-added silicon film 6a is deposited on the second gate insulating film 5 using the CVD method.

As illustrated in FIG. 26(b), the silicon film 6a is patterned to form the gate conductor 6. An anti-reflection coating and a resist film are deposited on the silicon film 6a, exposed and developed to pattern the resist film in the gate shape. After that, the phosphorus-added silicon film 6a is etched with a dry etcher. Etching is desirably stopped when an unnecessary silicon film 6a excluding the gate portion has been completely etched to minimize damage to the second gate insulating film 5 being the silicon oxide film.

As illustrated in FIG. 26(c), a silicon nitride film is deposited on the entire surface of the substrate and etched back to form the gate side wall 7. The silicon nitride film projected from the gate electrode is annealed and oxidized in an atmosphere containing $O_2$, $H_2O$, NO, $N_2O$ or oxygen radical. Radical oxidation using ISSG was performed herein. FIGS. 27(a) and 27(b) illustrate structures in the vicinity of the end of the gate electrode before and after the oxidation treatment. As illustrated in FIG. 27(a), the oxygen radical being oxidizing species of ISSG oxidation partly diffuses from the end of the gate side wall into the silicon nitride film (or, the charge accumulation layer 4) under the gate side wall and oxidizes the silicon nitride film. The amount of oxidation of the silicon nitride film under the gate side wall is dominated by the amount of diffusion of the oxygen radical, so that the amount of oxidation of the silicon nitride film becomes smaller as it gets apart from the gate side wall. Therefore, as illustrated in FIG. 27(b), the nitride film becomes thinner as it gets closer to the outside of the gate conductor. In particular, when the gate side wall 7 is formed of a material which is not permeable to oxygen, the tendency becomes more pronounced because oxygen diffuses from only at the end of the gate side wall. Furthermore, performing oxidation after the formation of the gate side wall 7 prevents a bird's beak from being formed under the lower end portion of the gate conductor 6 to allow suppressing increase in local stress. The portion of the charge accumulation layer exposed from the gate electrode is completely oxidized or the oxidation is stopped short of the position where the charge accumulation layer is exposed from the gate electrode, allowing preventing a bird's beak from being formed on the side of the substrate due to excessive oxidation. The charge accumulation layer outside the gate electrode is completely rendered an oxidation film by the above method to enable forming a good boundary in the charge accumulation layer at the end of the gate because defects are not produced in the charge accumulation layer at the end of the gate. Consequently, the retention property is improved as compared with that of the first conventional example. When the silicon nitride film is converted to the silicon oxide film by the oxidation treatment, its thickness becomes greater than the initial thickness. As a result, as illustrated in FIG. 27(b), the second gate insulating film 5 is raised outside the gate conductor 6.

Although, in the present embodiment, the nitride film of the portion of the gate side wall and the exposed portion is oxidized after the formation of the gate side wall 7, the oxidation treatment may be performed before the formation of the gate side wall portion to oxidize the nitride film and the surface of the gate conductor 6 at the same time, forming the gate side wall. This method can eliminate the steps for depositing and etching back the insulating film and reduce the number of steps, however, a bird's beak is liable to be produced at the lower portion of the gate conductor 6 as stated above.

As illustrated in FIG. 26(d), ions are implanted self-alignedly with the gate electrode, and thereafter, an activation process is performed to form an impurity diffusion layer 9 functioning as a source and a drain region. As illustrated in FIG. 26(e), a non-doped silicate glass (NGS) film is deposited on the entire surface and etched back to form the side wall 8. Thus, a trap memory of the present embodiment can be formed through the above steps.

FIG. 28 is a schematic diagram illustrating an electron trap density and accumulated charge distribution at the time of writing in the vicinity of the drain of the trap memory cell according to the present embodiment. A vacant electron trap and an electron trap capturing an electron are illustrated by a blank and a shaded square respectively. The application of a positive high voltage to the gate and the drain generates channel hot electrons (CHE), so that the electrons are injected into the charge accumulation layer 4 as shown by the distribution 11. In this case, when the electrons are injected into the region where vacant traps exist, the electrons are captured. When the electrons are injected into the region where no vacant trap exists, the injected electrons escape to the gate electrode or diffuse sideways in the charge accumulation layer and captured by vacant traps. The electrons in the charge accumulation layer 4 easily diffuse in the initial film-thickness region 4d which is high in a trap surface-density, but hardly diffuse in the thin-film region 4e which is low in an electron trap surface-density. When an electric charge trap surface-density is $10^{11}$ $cm^{-2}$ or less in particular, the trapped electrons hardly diffuse into the charge accumulation layer. Consequently, the present invention allows suppressing the diffusion of overflowing electrons toward the outside of the gate electrode and the capture thereof at the region outside the gate electrode, and incomplete erasure resulting therefrom.

Overflowing electrons easily diffuse into an area high in an electron trap surface-density in the region where the electron trap surface-density is continuously varied. This effectively collects the overflowing electrons in the area high in a trap surface-density to improve a writing efficiency. In particular, when the region where the electric charge trap surface-density is continuously or stepwise lowered is located under the gate side wall portion, an injection electric charge distribution is high even under the gate side wall, allowing more effectively accumulating electric charges.

FIGS. 29(a) and 29(b) are schematic diagrams illustrating additional factors behind the inflow of electric charges into the charge accumulation layer at the production process and the outflow of accumulated written electric charges. At the time of high current ion implantation, part of charge-up neutralizing electron beams flows from the outside of the gate electrode into the charge accumulation layer 4 and is accumulated therein. The inflow electric charge is a factor which increases the initial threshold value VT. In the present embodiment, the portion of the charge accumulation layer 4 outside the gate electrode is thinned to decrease an electron trap surface-density and the silicon oxide film (or, the second gate insulating film 5 and the non-trap region 4c) is thickened outside the end of the gate electrode, thereby allowing substantially suppressing charge-up neutralizing electrons from flowing into under the gate electrode directly or through the charge accumulation layer outside the gate electrode.

In addition, the production method of the present embodiment suppresses the defect 17 from being generated at the boundary between the gate side wall 7 and the second gate insulating film 5. As a result, the accumulated electric charges are suppressed from flowing out through the defect 17 at the boundary.

Example 6

FIG. 30 is a top view of an example 6 of the present invention. FIGS. 31(*a*) and 31(*b*) are cross sections taken along lines A-A and B-B in FIG. 30. In FIGS. 30 and 31, the same portions as those in the second exemplary embodiment illustrated in FIGS. 23 and 24 are denoted by the same reference numerals as those in FIGS. 23 and 24 and the duplicated description thereof is omitted. In the present embodiment, the region of the charge accumulation layer 4 immediately under the gate conductor 6 is rendered an initial film-thickness region 4d whose thickness remains unchanged, but the thin-film region disappears in the region of the charge accumulation layer 4 outside the gate side wall 7 and the charge accumulation layer 4 is oxidized across the entire thickness thereof and rendered the non-trap region 4c. In the region sandwiched between initial film-thickness region 4d and the region without electric charge traps, the thickness of the charge accumulation layer which is high in an electric charge trap surface-density is continuously decreased toward the outside of the gate. Eliminating electric charge traps outside the end of the gate electrode allows suppressing the inflow of electric charges from the outside. Since electric charges produced by injecting hot electrons have a distribution in the vicinity of the end of the gate electrode, the charge accumulation layer which is high in an electric charge trap surface-density is gradually thickened under the gate side wall to enable improving an electric charge writing efficiency and suppressing the accumulated electric charges from flowing out to the outside of the gate electrode.

Example 7

FIG. 32 illustrates the example 7 in which the memory cell structure of the present invention is applied to a MONOS trap memory. In FIG. 32, the same portions as those in the second exemplary embodiment illustrated in FIGS. 23 and 24 are denoted by the same reference numerals as those in FIGS. 23 and 24 and the duplicated description thereof is omitted. In the present example, control gates 14 are disposed through laminate insulating films 15 on both sides of the word gate 13 which is formed through a gate insulating film 16 on the silicon substrate 1. The first gate insulating film 3, the charge accumulation layer 4 and the second gate insulating film 5 are formed over the silicon substrate under the control gate 14. In the present example, the region of the charge accumulation layer 4 immediately under the control gate 14 is rendered the initial film-thickness region 4d whose thickness remains unchanged, but the region of the charge accumulation layer 4 outside the gate side wall 7 is oxidized across the entire thickness thereof and rendered the non-trap region 4c. The thickness of the charge accumulation layer containing high-density electric charge traps under the gate side wall 7 of the control gate 14 is gradually decreased as it gets away from the control gate. This structure can be produced such that oxidation is performed with the charge accumulation layer 4 exposed from the control gate 14 and the gate side wall 7 thereof and the charge accumulation layer exposed from the gate electrode is converted to the oxide silicon film. The formation of the charge accumulation layer allows improving a writing efficiency and lowering an incomplete erasure. The thickness of the silicon oxide film (or, the second gate insulating film and the non-trap region 4c) under and outside the gate side wall is increased and an electric charge trap surface-density outside the gate sidle wall is set to $1011$ $cm^{-2}$ or less to allow suppressing the inflow of electric charges from the outside of the end of the gate during the process and the outflow of accumulated electric charges and improving the uniformity of the initial threshold value VT and the retention property of the accumulated electric charges.

In the above, although the trap memory, the split gate trap memory and the twin MONOS trap memory which are simple in gate structure are described, the present invention is not limited to the above memories, but is applicable to all trap memories equipped with a trap layer and a gate electrode. Furthermore, the above description mainly uses a nitride film as a charge accumulation layer, but the use of $Al_2O_3$, $HfO_2$, AlxSiyOz and HfxSiyOz instead of the nitride film brings about the same effect. The trap memory of the present invention can form an LSI by itself and be mounted along with a logic circuit and a DRAM.

BRIEF DESCRIPTION OF THE DRAWINGS

FIG. 1 is a top view of a first example of a conventional trap memory;

FIG. 2 is cross sections taken along lines A-A and B-B in FIG. 1;

DESCRIPTION OF SYMBOLS

Figure 3:
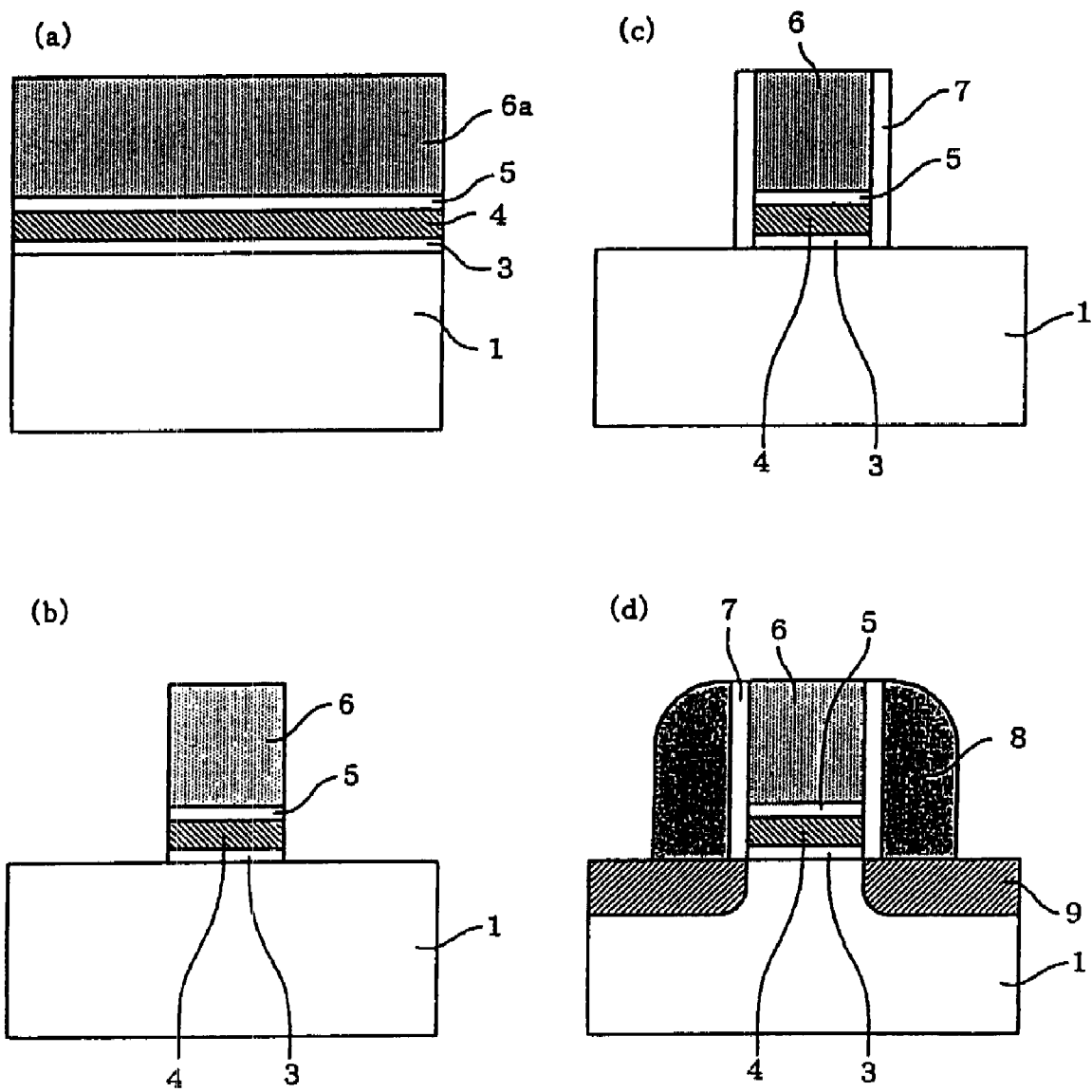
FIG. 3 is cross sections illustrating the production method for a first conventional example according to the order of processes.
Figure 4:
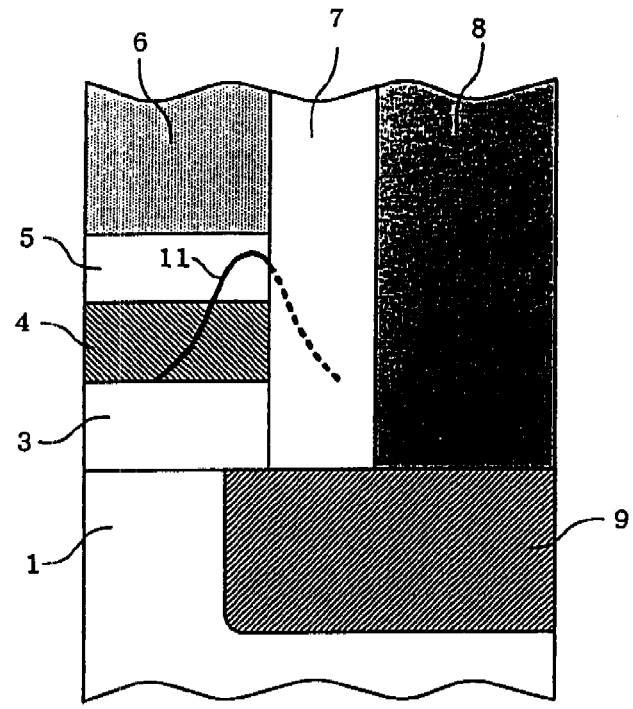
FIG. 4 is a partially enlarged cross section of the vicinity of a drain in a memory cell of the first conventional example and the distribution of electrons injected into an insulating film by injecting CHE.
Figure 5:
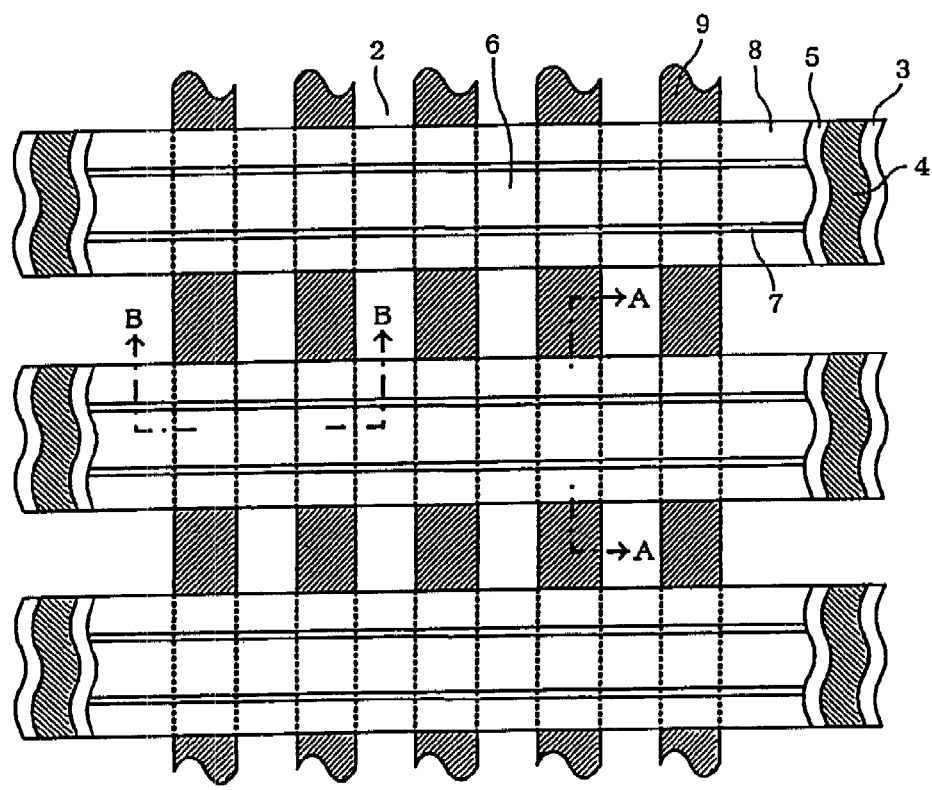
FIG. 5 is a top view of a second example of a conventional trap memory.
Figure 6:
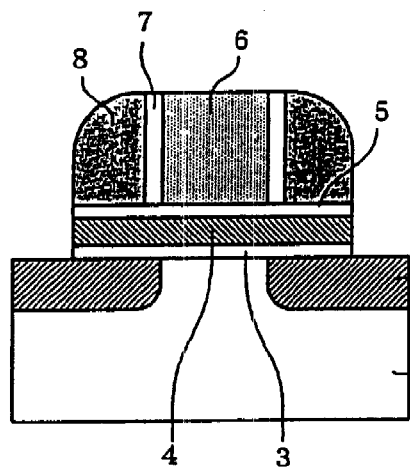
FIG. 6 is cross sections taken along lines A-A and B-B in FIG. 5.
Figure 6:
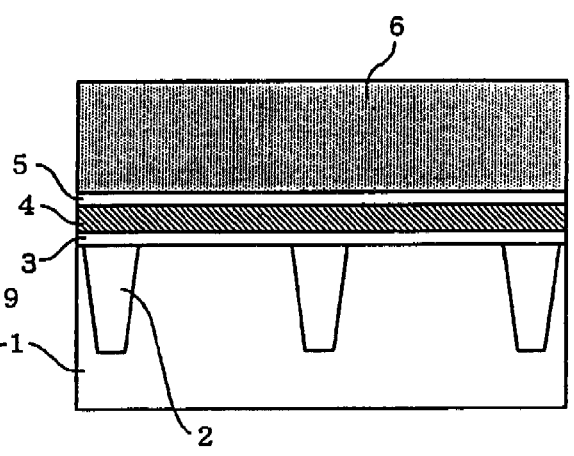
Figure 7:
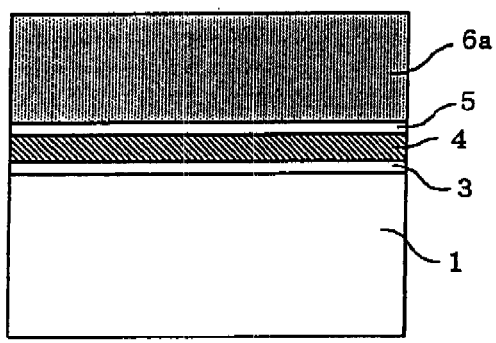
FIG. 7 is cross sections illustrating the production method for a second conventional example according to the order of processes.
Figure 7:
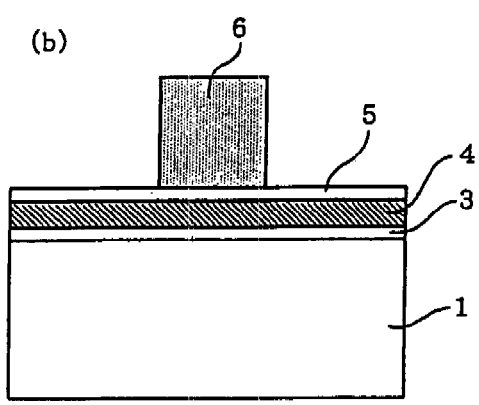
Figure 7:
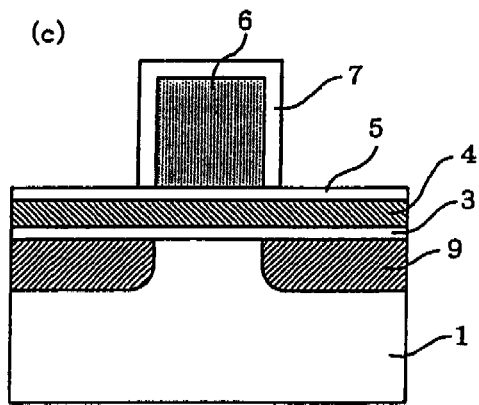
Figure 7:
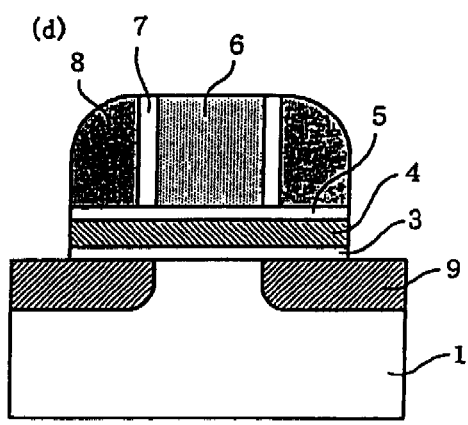
Figure 8:
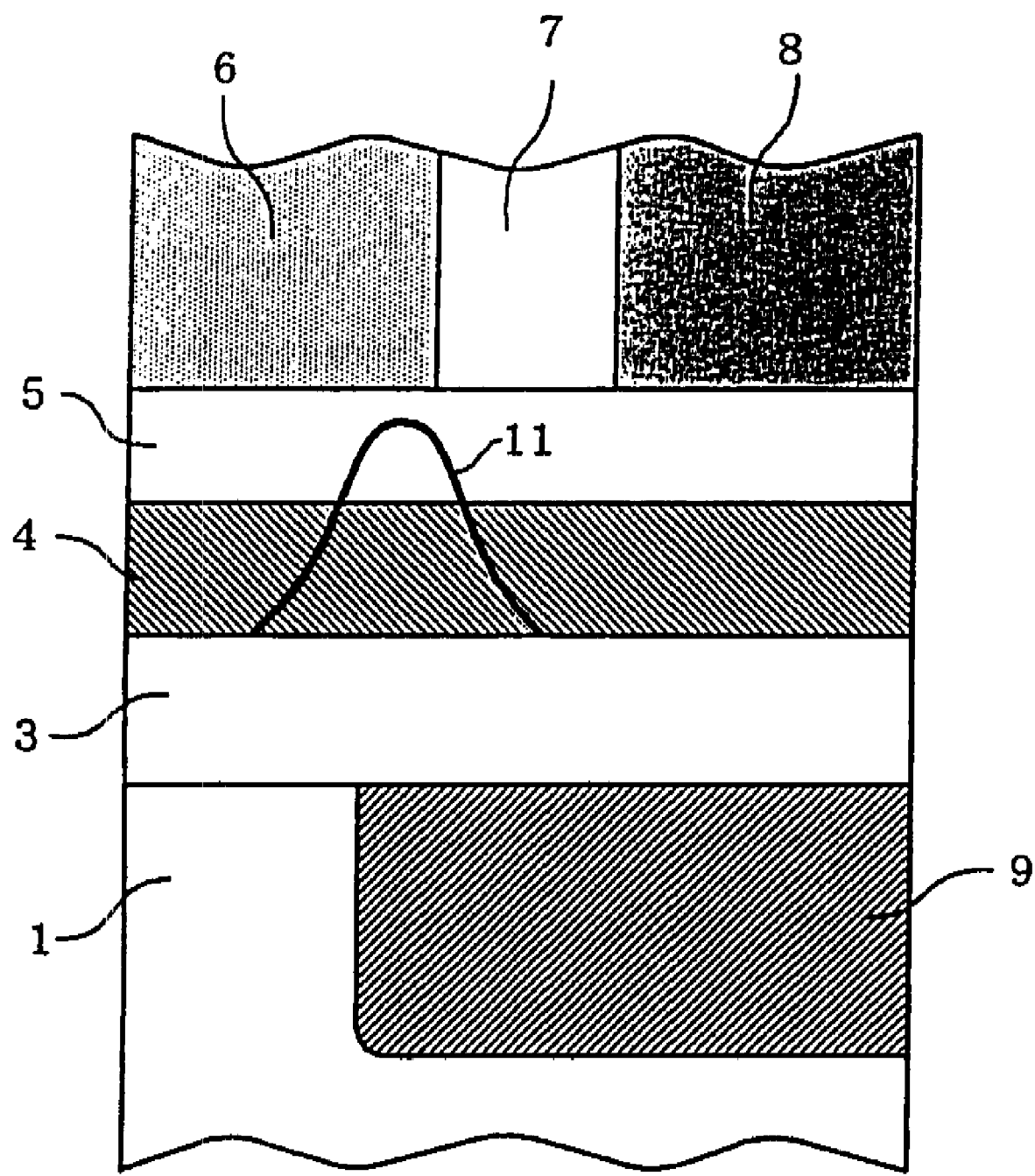
FIG. 8 is a partially enlarged cross section of the vicinity of a drain in a memory cell of the second conventional example and the distribution of electrons injected into an insulating film by injecting CHE.
Figure 9:
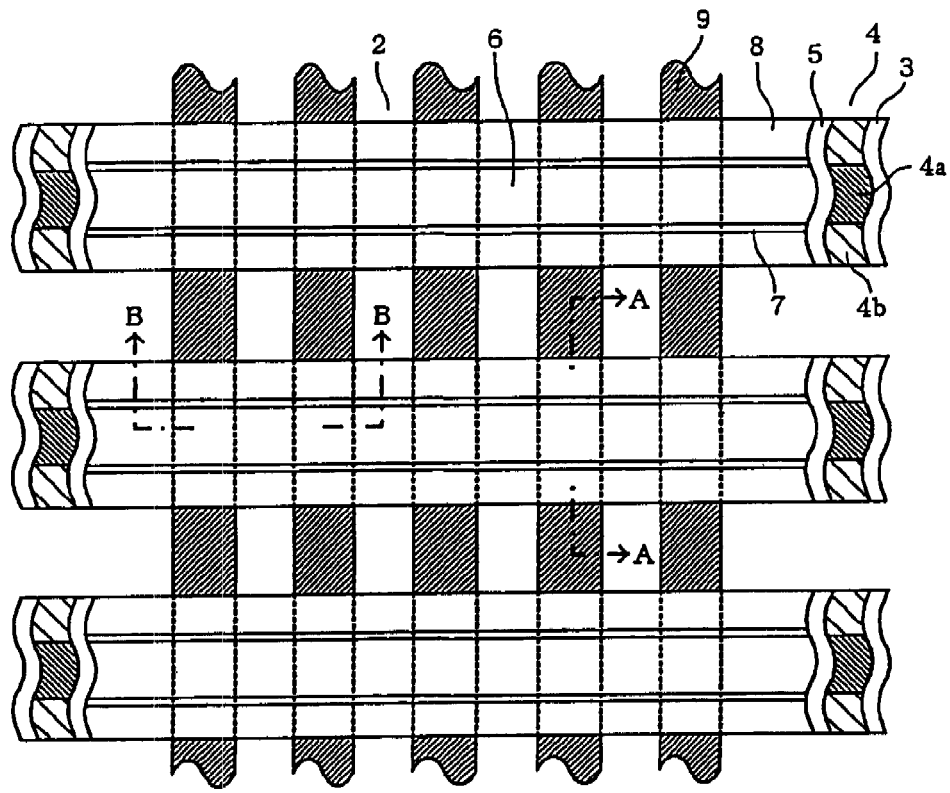
FIG. 9 is a top view of a trap memory according to the first exemplary embodiment of the present invention.
Figure 10:
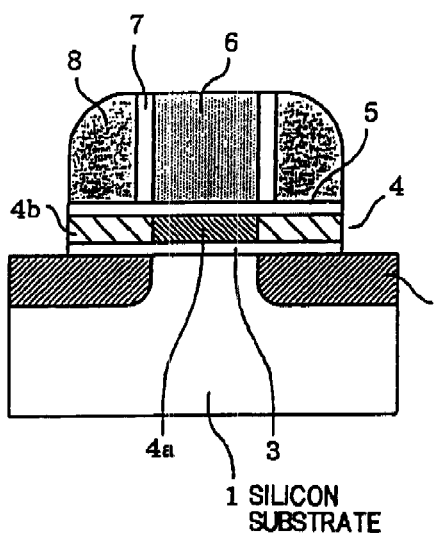
FIG. 10 is cross sections taken along lines A-A and B-B in FIG. 9.
Figure 10:
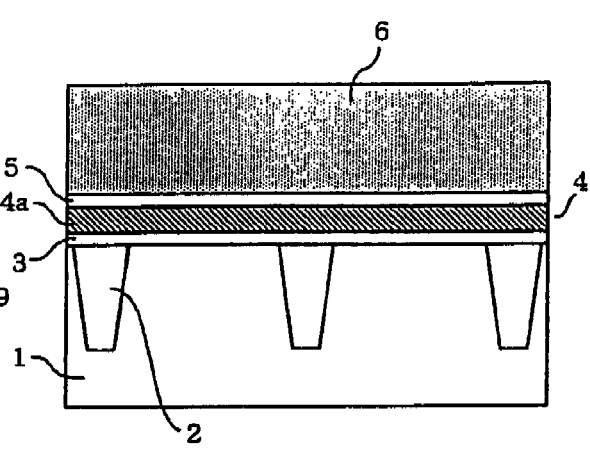
Figure 11:
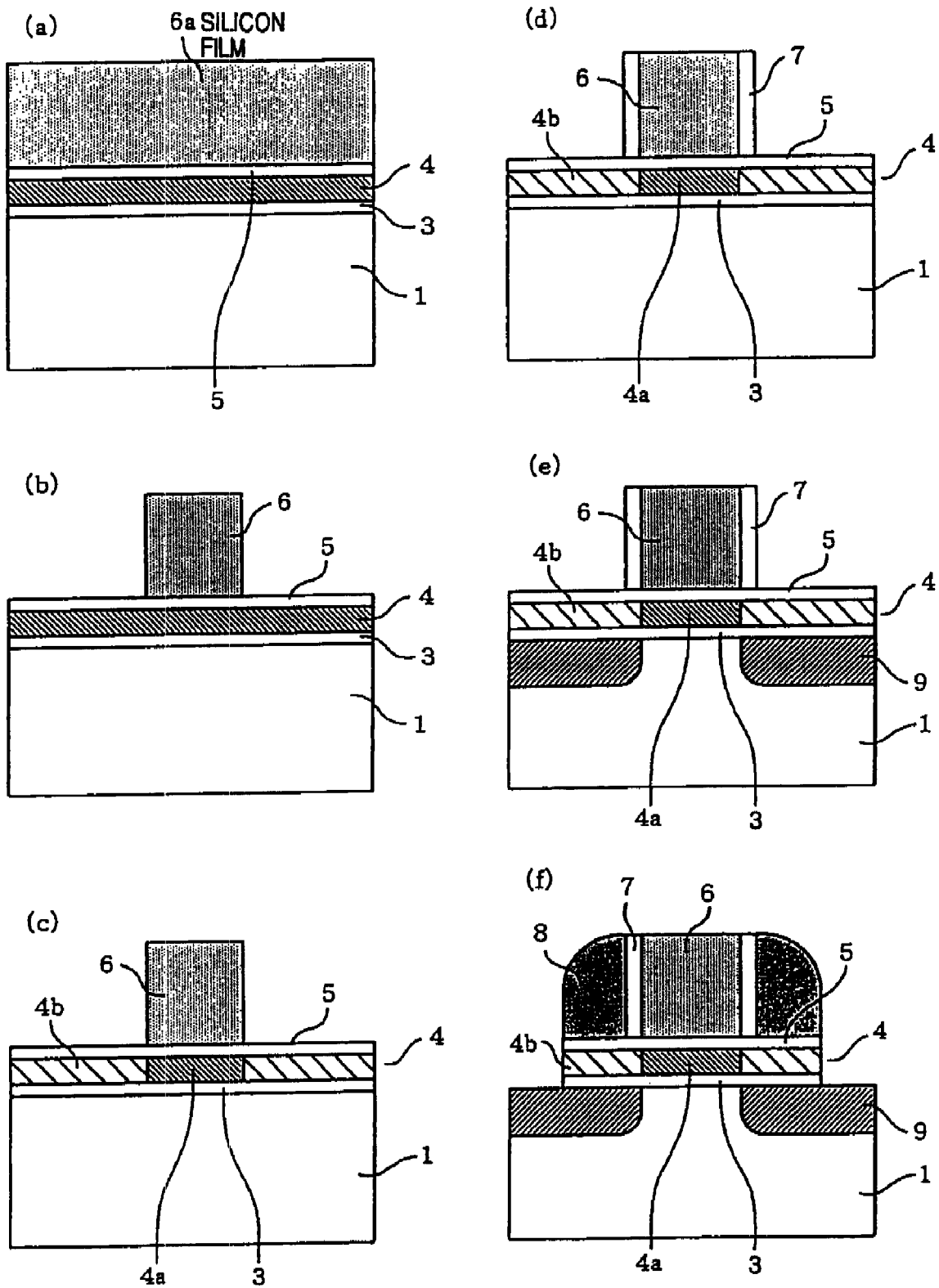
FIG. 11 is cross sections illustrating the production method for the trap memory cell of the first exemplary embodiment of the present invention according to the order of processes.
Figure 12:
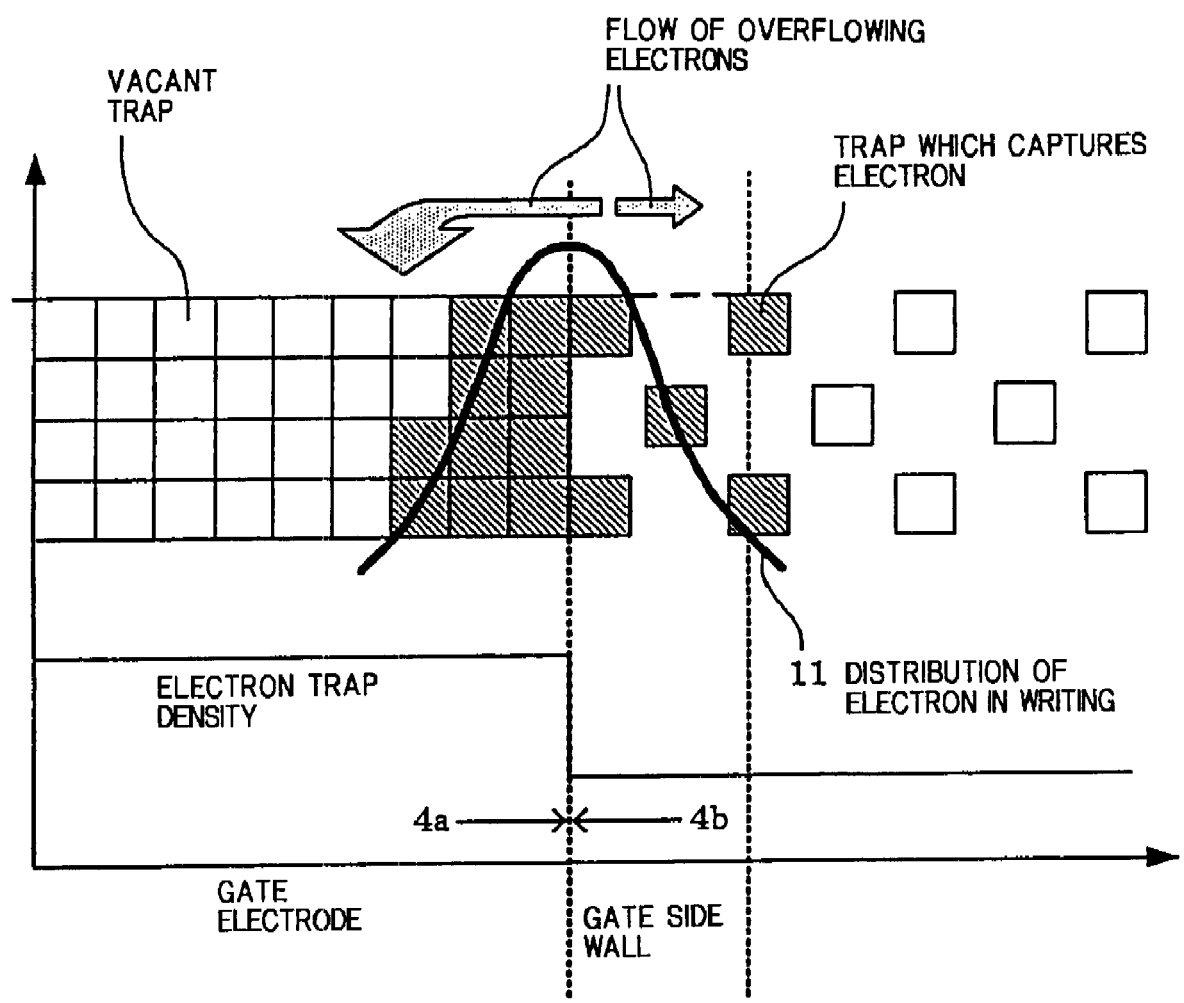
FIG. 12 is a schematic diagram illustrating an electron trap density and an electric charge accumulating mechanism in FIG. 13 is schematic diagrams describing the inflow of electric charges into the charge accumulation layer at the ion implantation process and the diffusion of accumulated electric charges.
Figure 13:
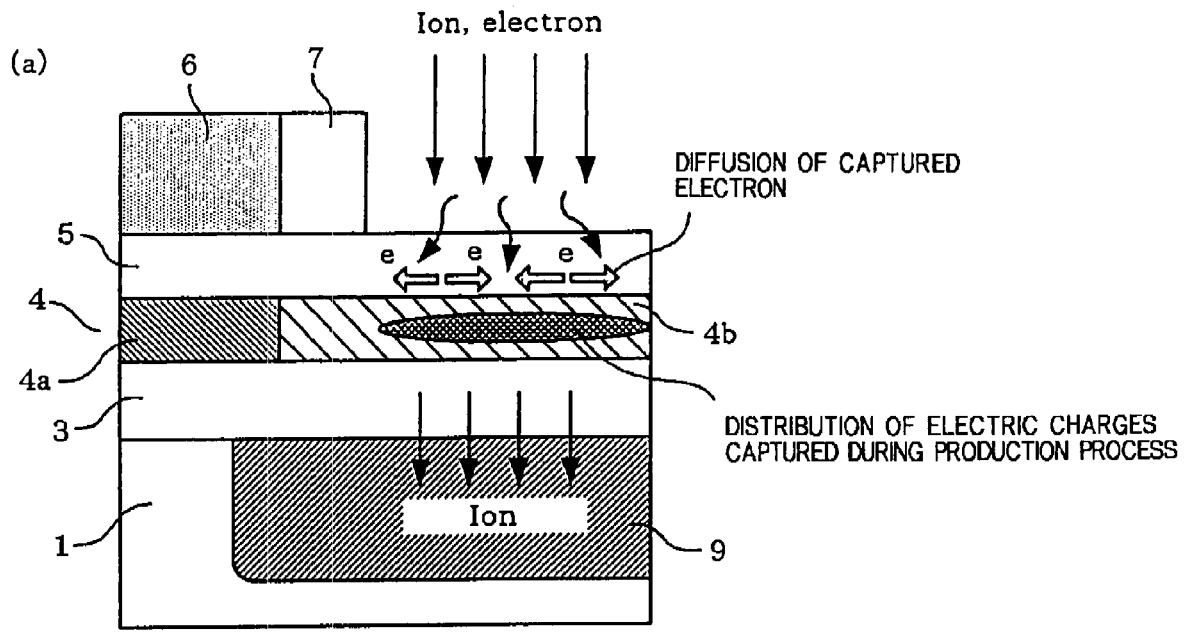
Figure 13:
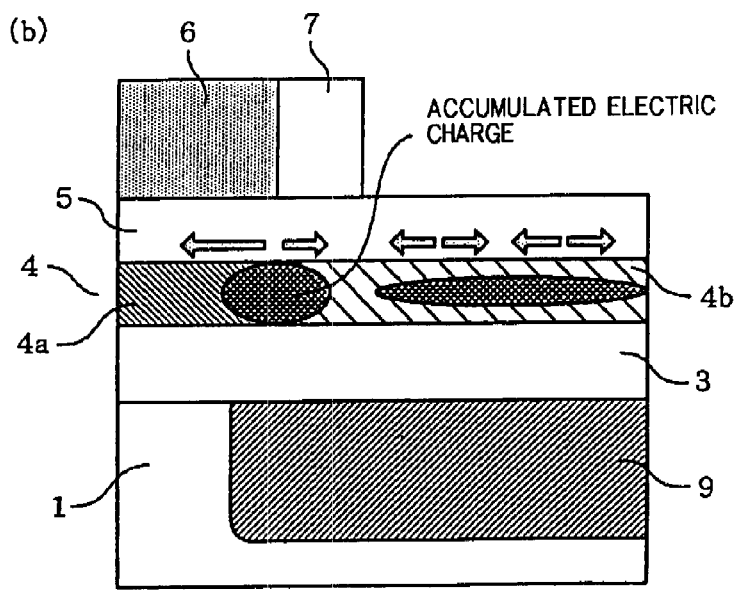
Figure 14:
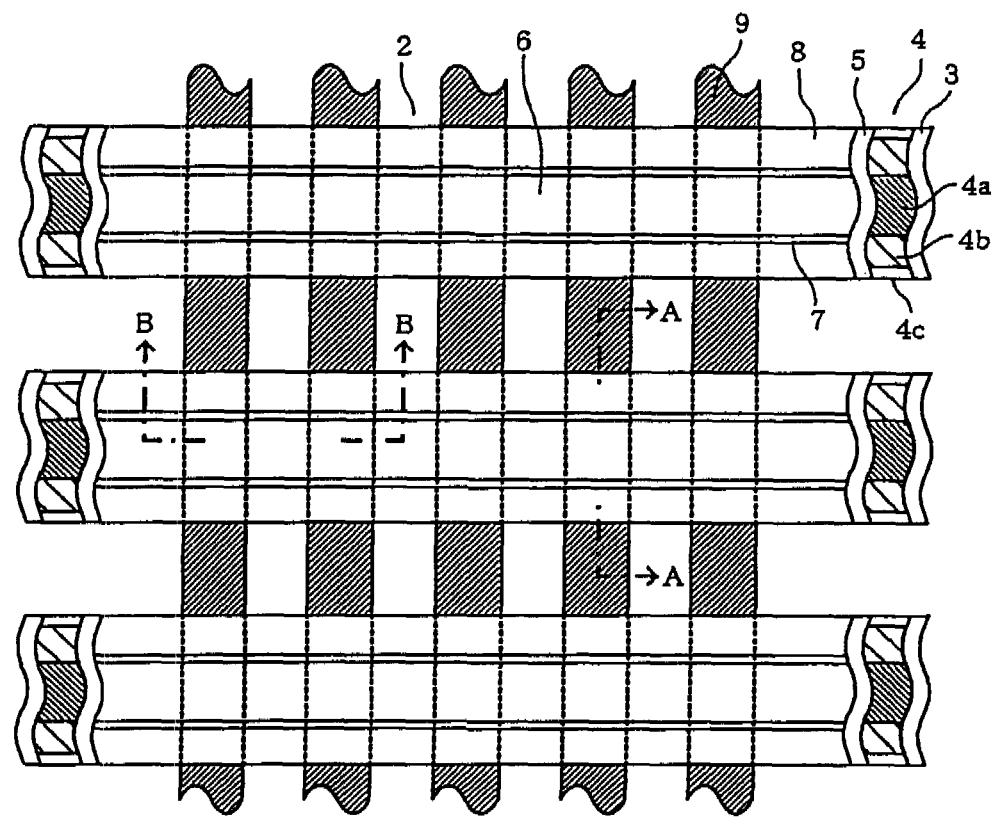
FIG. 14 is a top view of an example 1 of the present invention.
Figure 15:
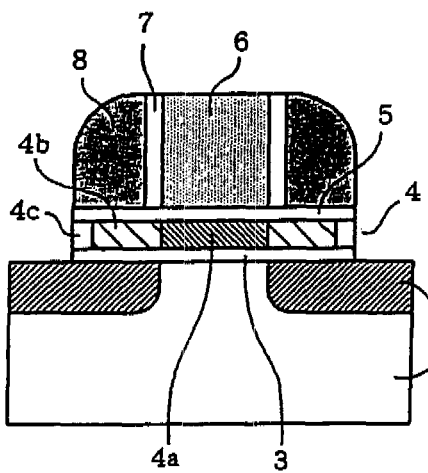
FIG. 15 is cross sections taken along lines A-A and B-B in FIG. 14.
Figure 15:
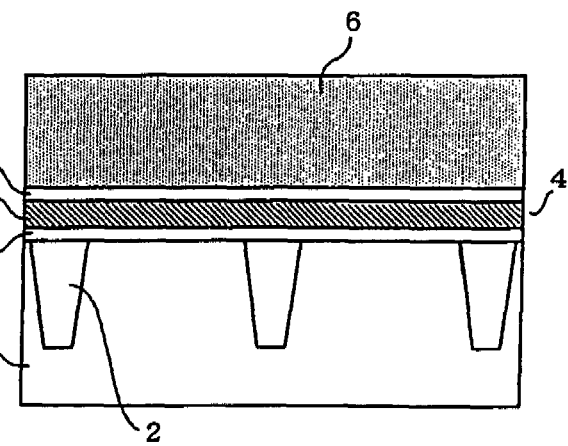
Figure 16:
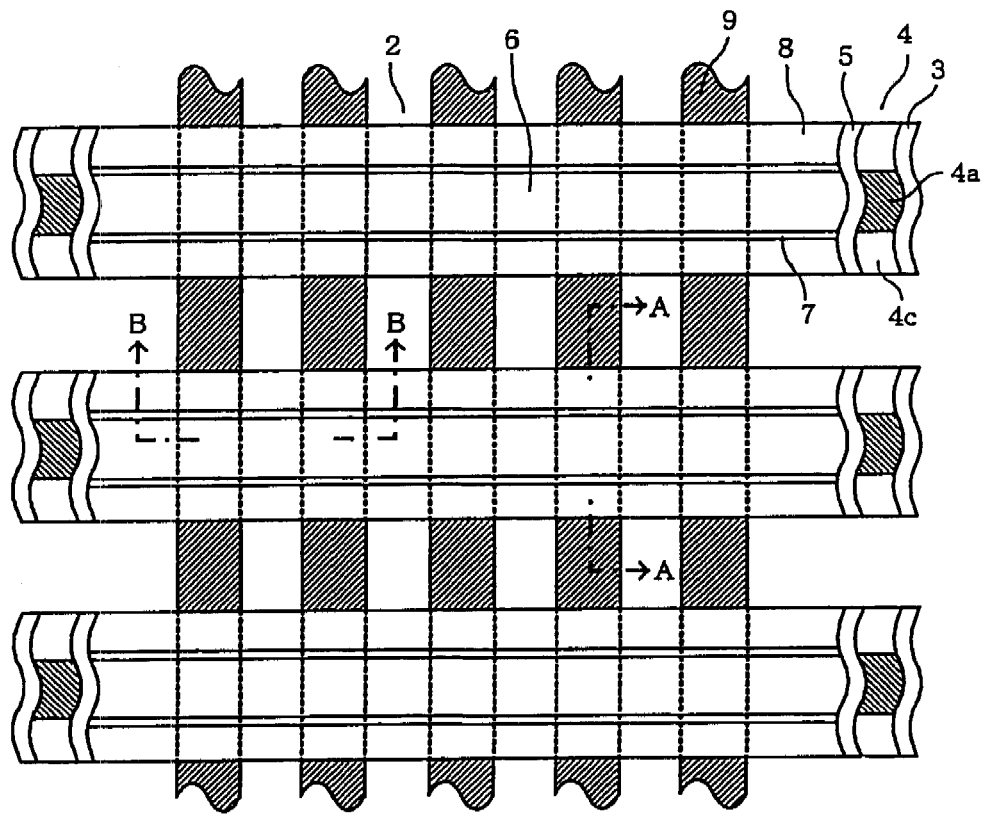
FIG. 16 is a top view of an example 2 of the present invention.
Figure 17:
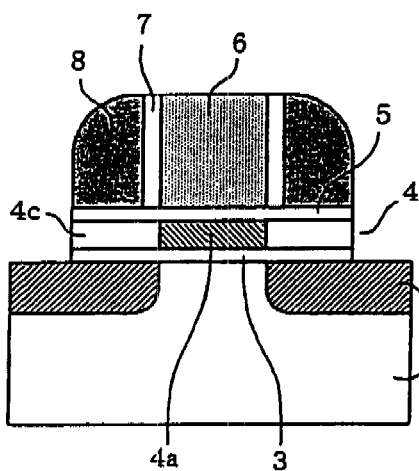
FIG. 17 is cross sections taken along lines A-A and B-B in FIG. 16.
Figure 17:
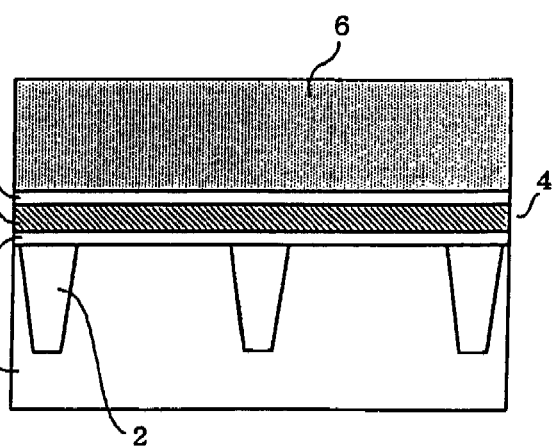
Figure 18:
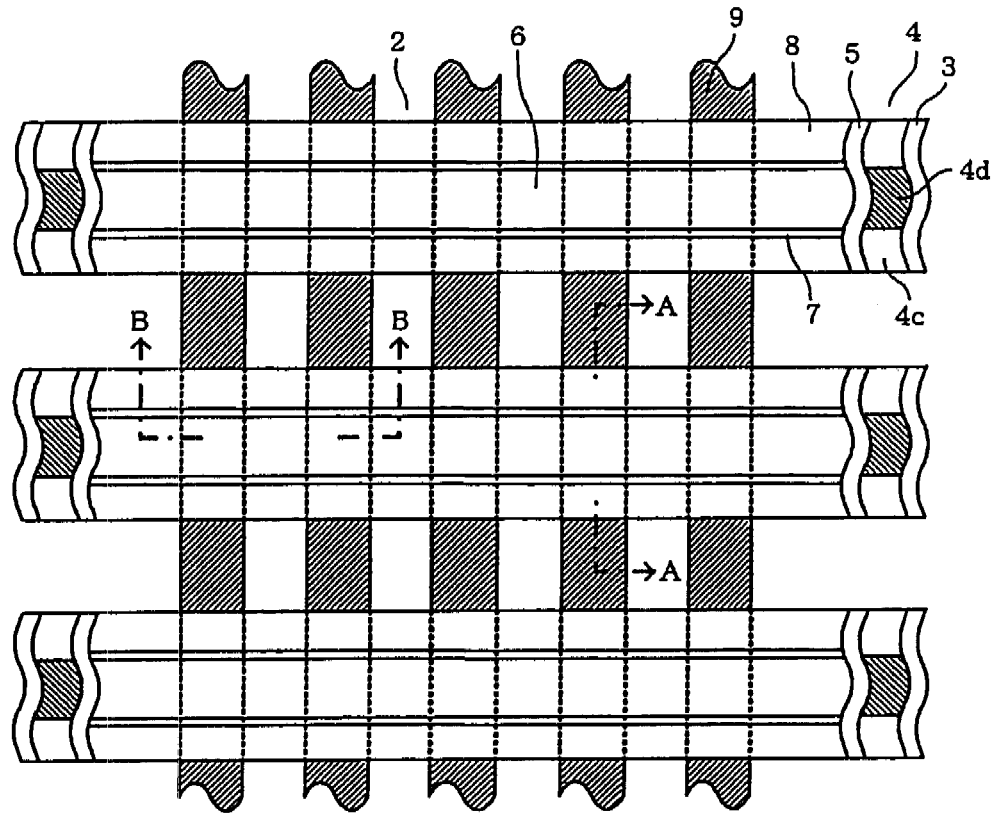
FIG. 18 is a top view of an example 3 of the present invention.
Figure 19:
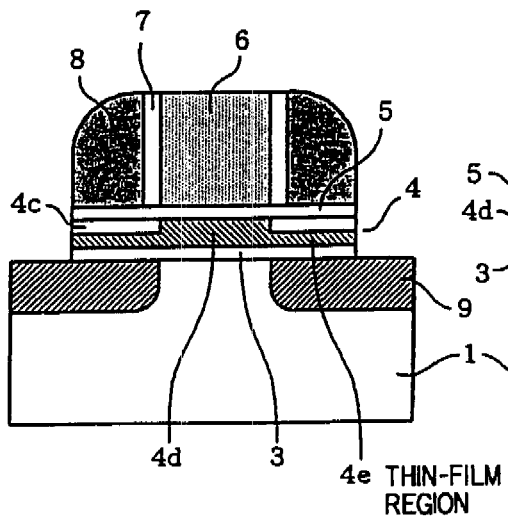
FIG. 19 is cross sections taken along lines A-A and B-B in FIG. 18.
Figure 19:
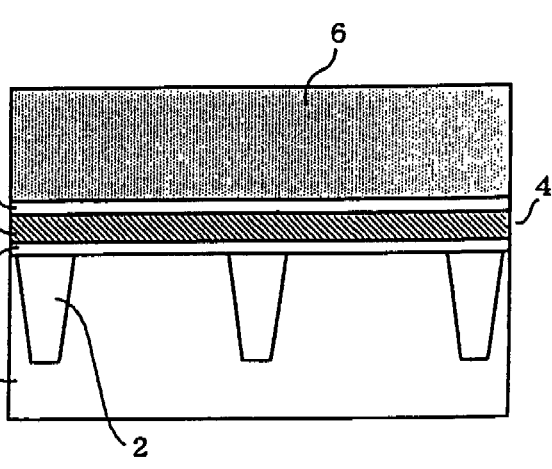
Figure 20:
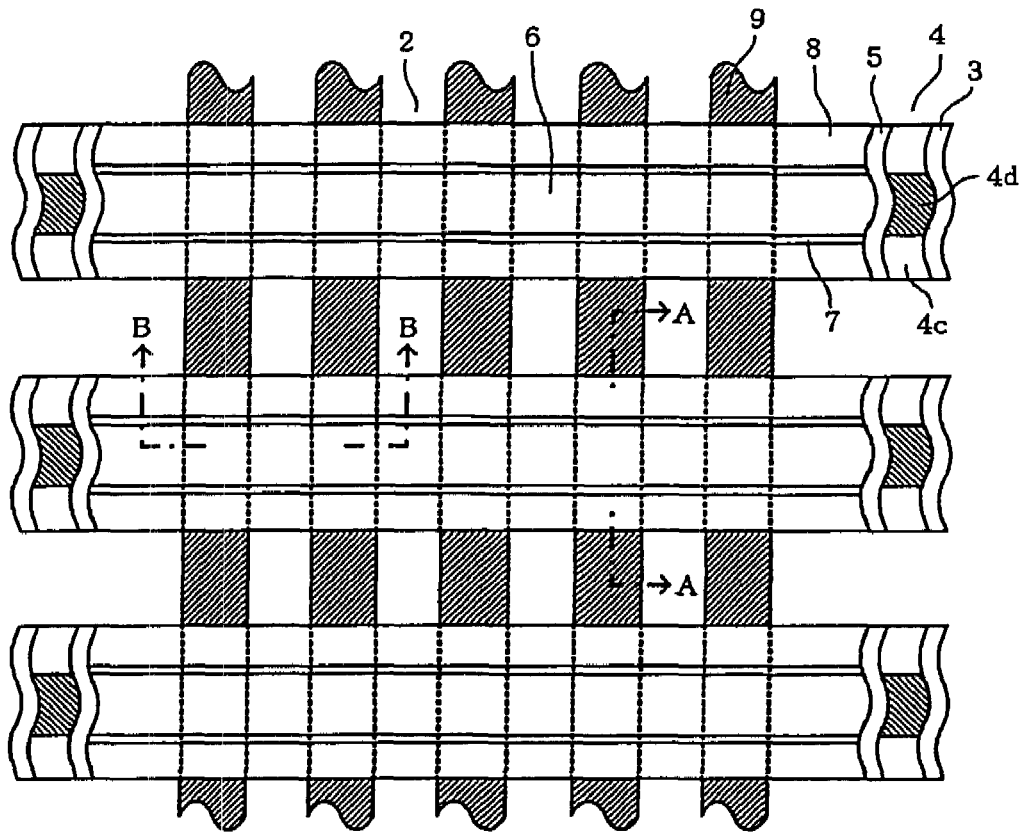
FIG. 20 is a top view of an example 4 of the present invention.
Figure 21:
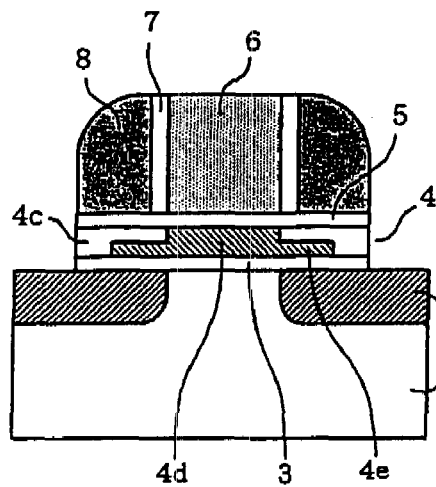
FIG. 21 is cross sections taken along lines A-A and B-B in FIG. 20.
Figure 21:
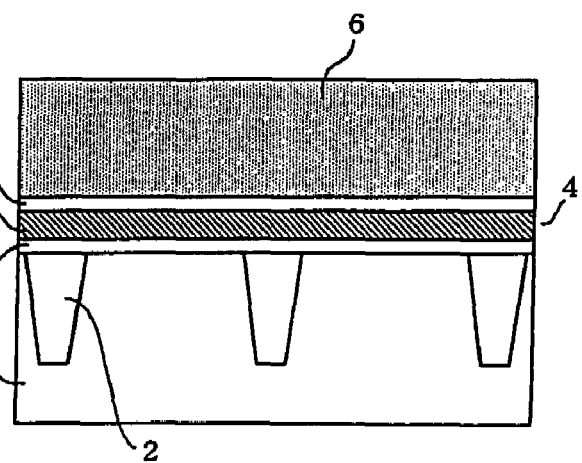
Figure 22:
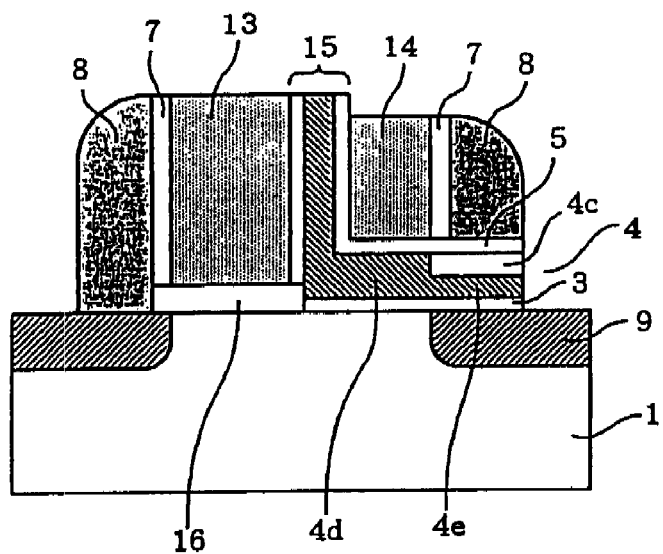
FIG. 22 is a cross section illustrating the structure of an example 5 in which the present invention is applied to a split gate trap memory cell.
Figure 23:
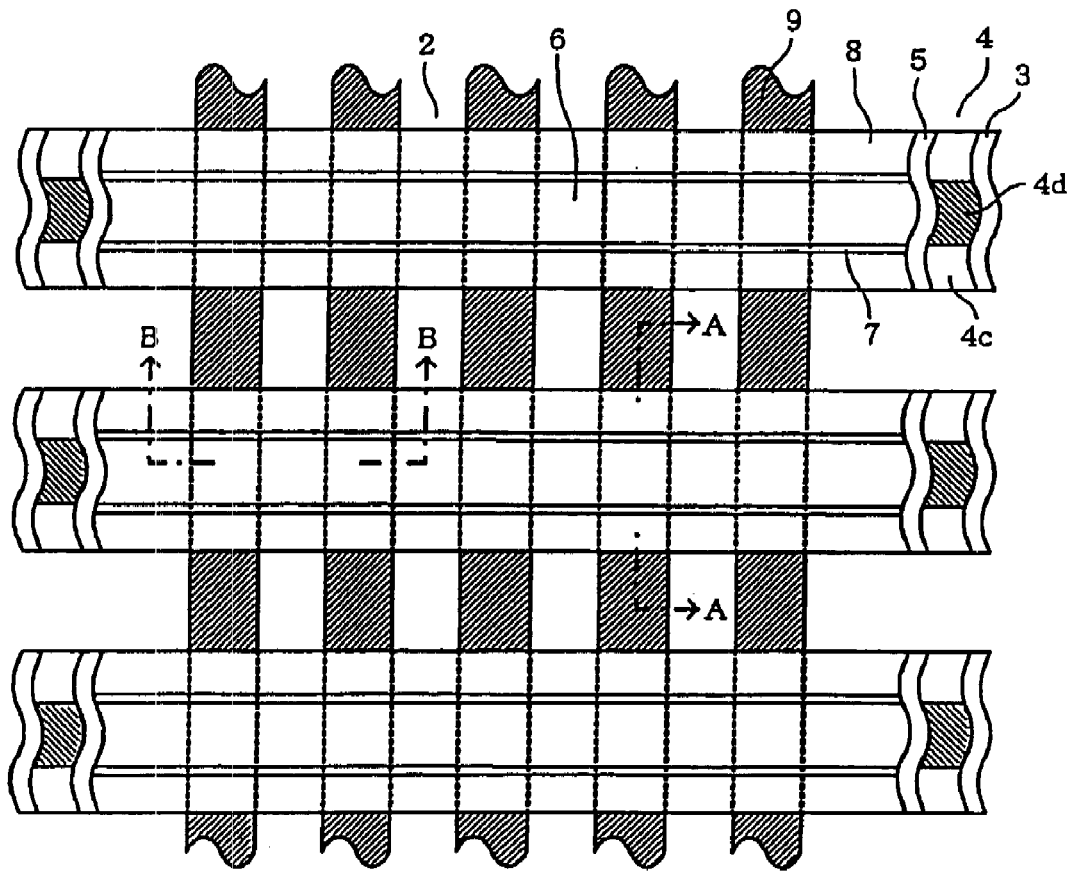
FIG. 23 is a top view of a trap memory according to the second exemplary embodiment of the present invention.
Figure 24:
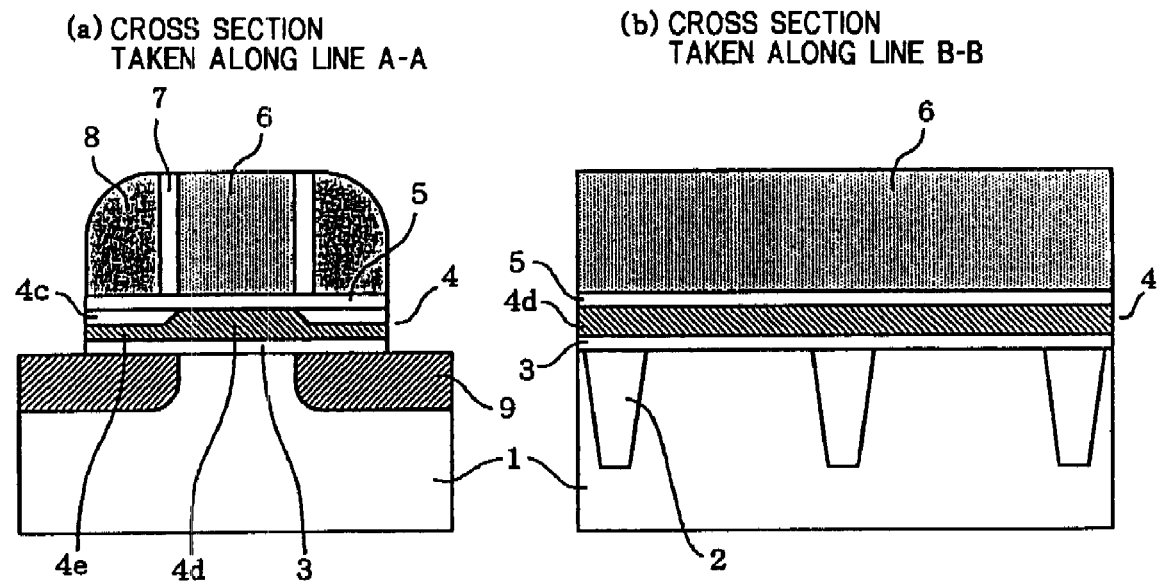
FIG. 24 is cross sections taken along lines A-A and B-B in FIG. 23.
Figure 25:
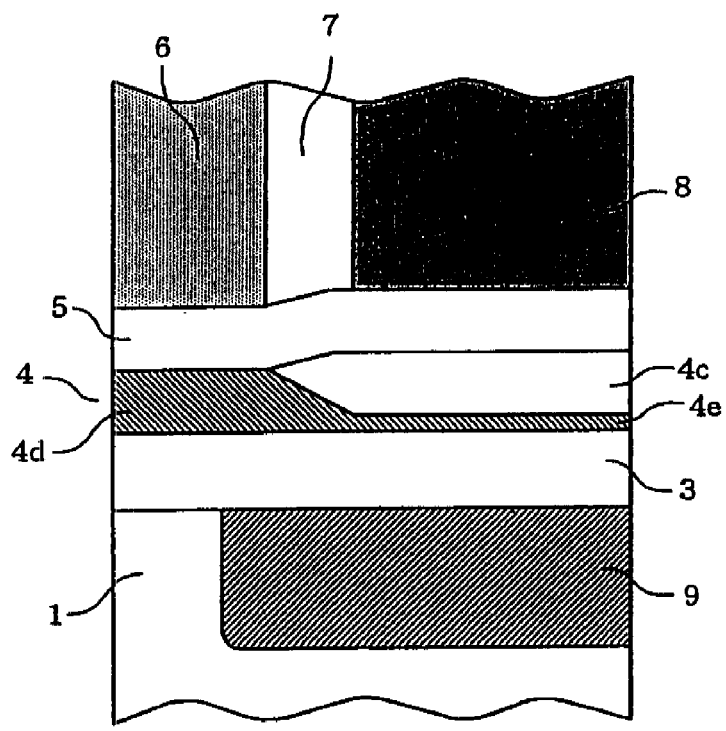
FIG. 25 is a partially enlarged cross section of the vicinity of the drain of the trap memory cell according to the second exemplary embodiment of the present invention.
Figure 26:
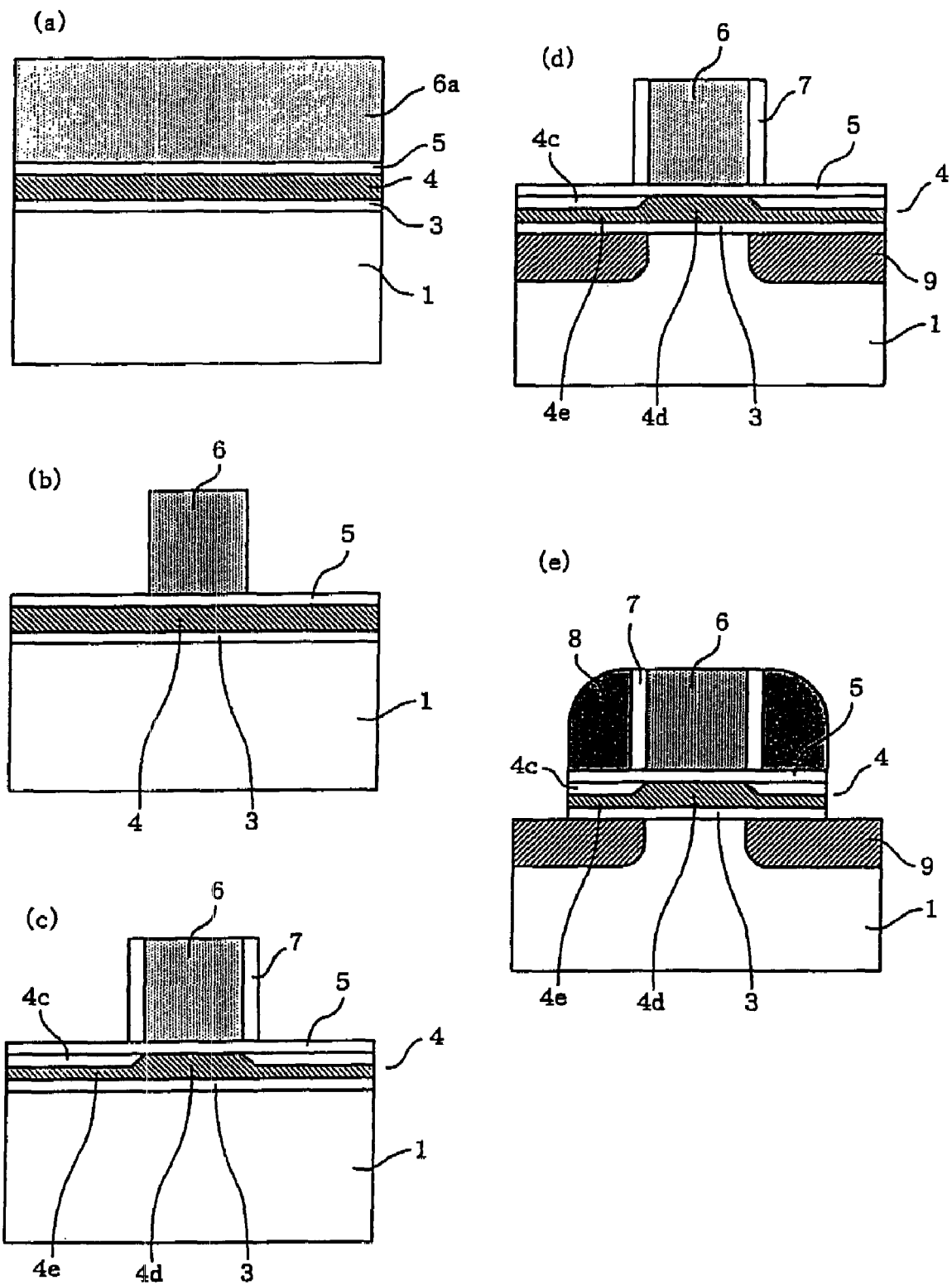
FIG. 26 is cross sections illustrating the production method for the trap memory cell of the second exemplary embodiment of the present invention according to the order of processes.
Figure 27:
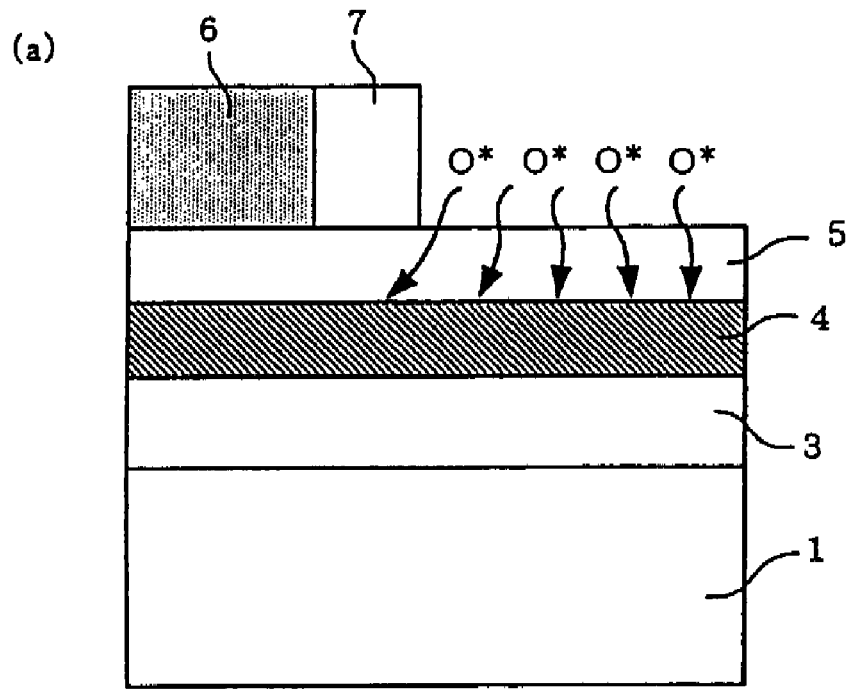
FIG. 27 is schematic diagrams illustrating an oxidation film process at the exposed portion of the charge accumulation layer by radical oxidation of the charge accumulation layer and the shape of the laminate insulating film in the vicinity of the gate end according to the second exemplary embodiment of the present invention.
Figure 27:
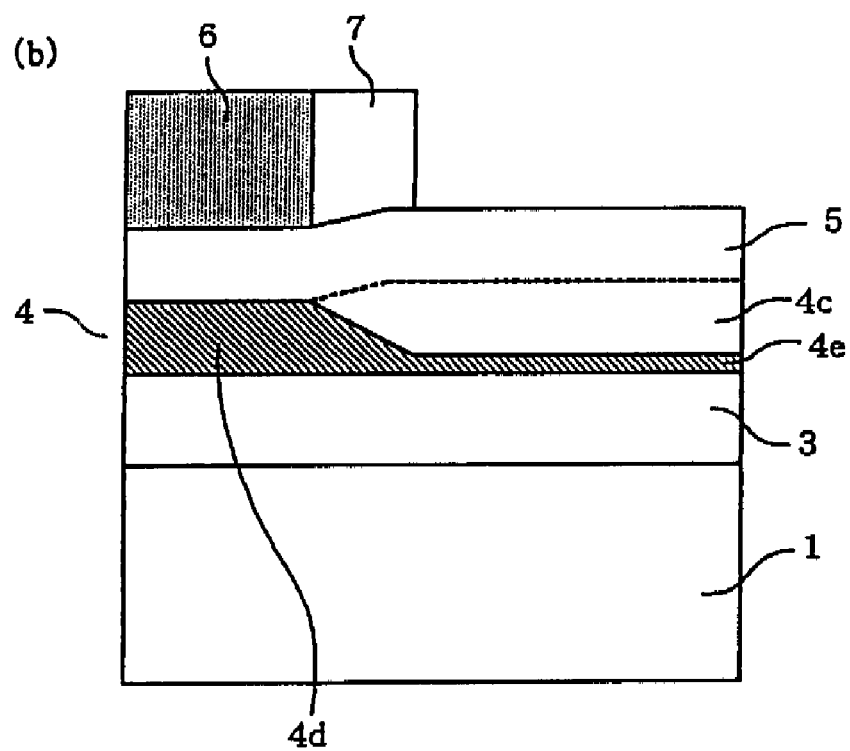
Figure 28:
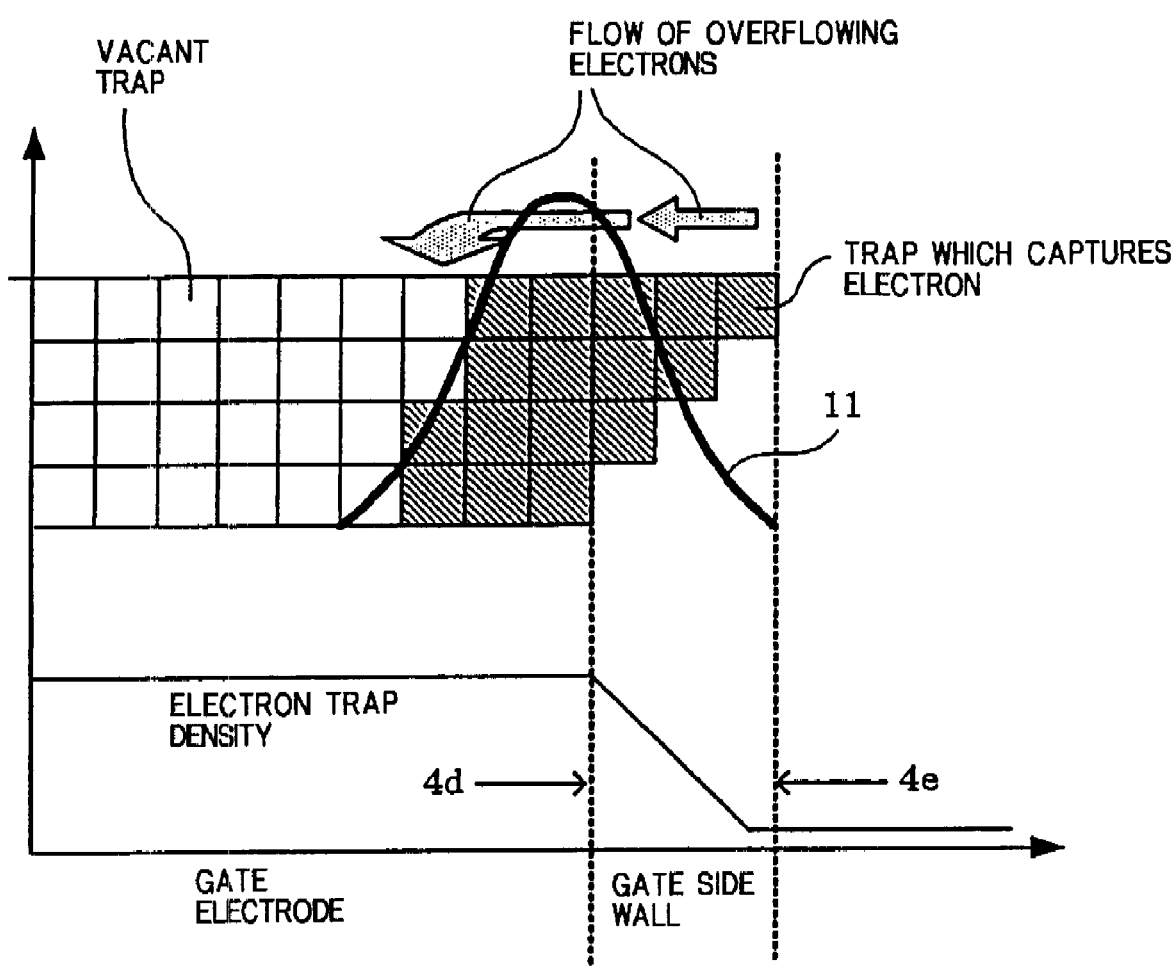
FIG. 28 is a schematic diagram illustrating an electron trap density and an electric charge accumulating mechanism in the vicinity of the drain of the trap memory cell according to the second exemplary embodiment of the present invention.
Figure 29:
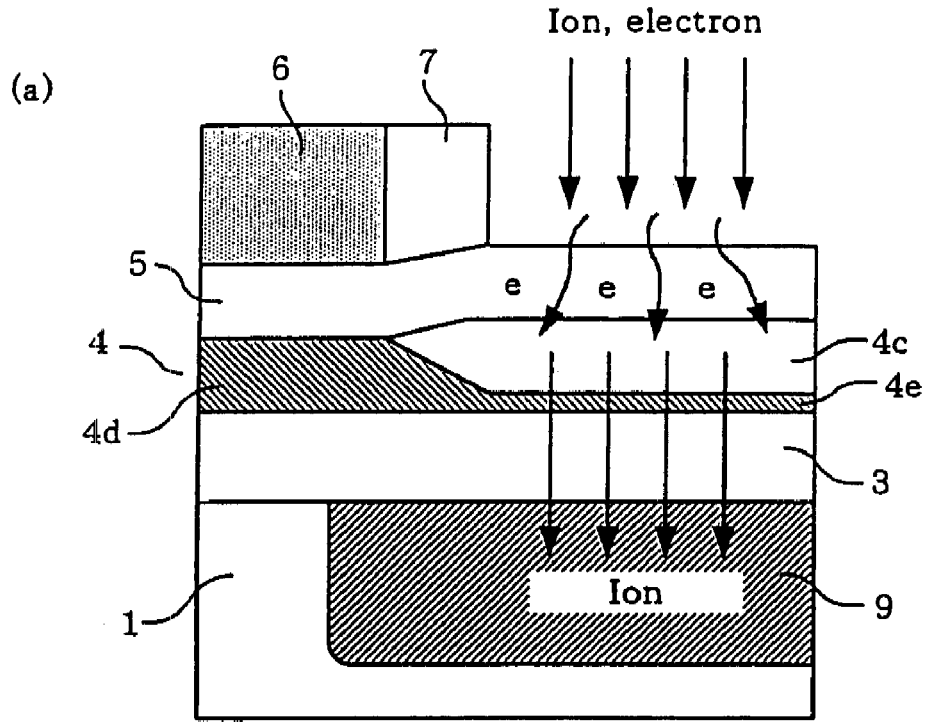
FIG. 29 is schematic diagrams describing the inflow of electric charges into the charge accumulation layer at the ion implantation process and the diffusion of accumulated electric charges.
Figure 29:
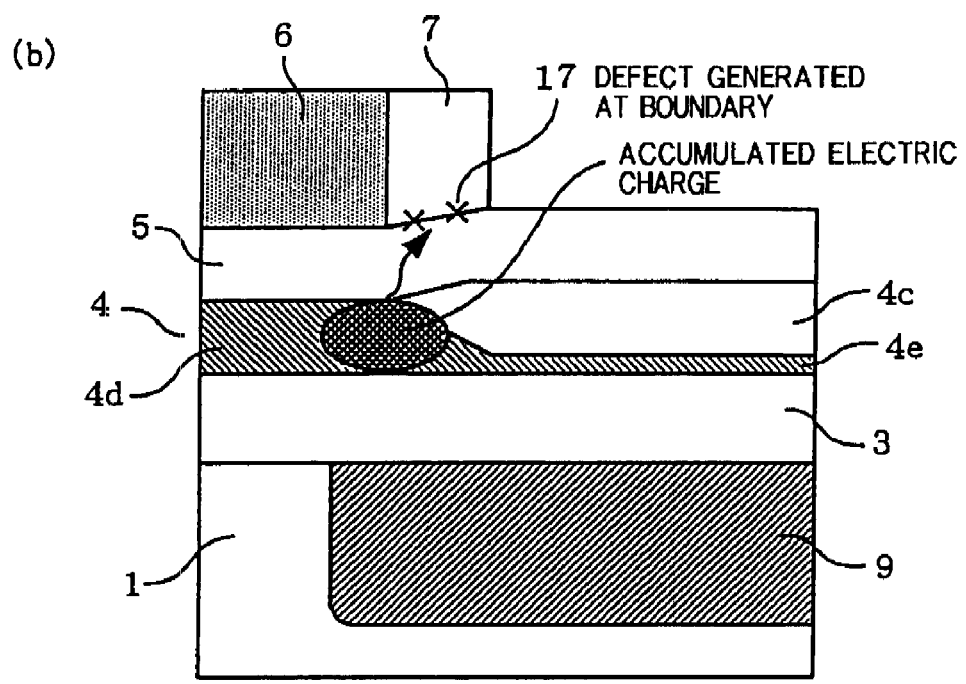
Figure 30:
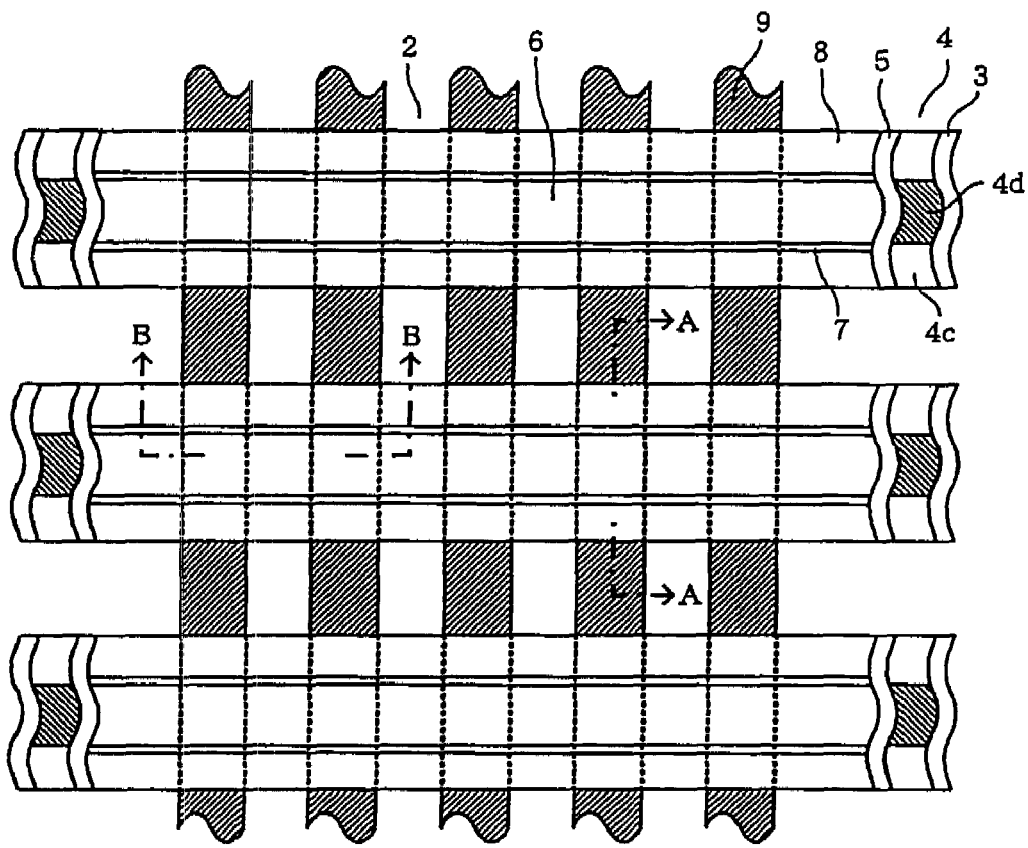
FIG. 30 is a top view of an example 6 of the present invention.
Figure 31:
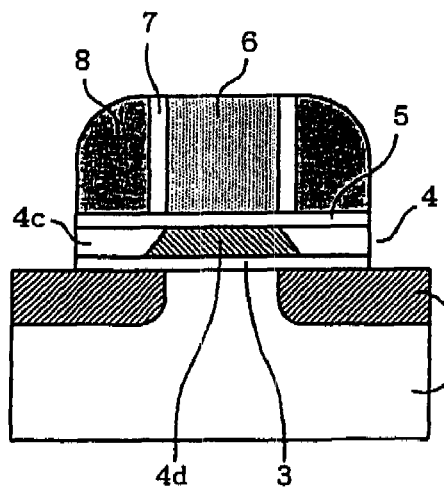
FIG. 31 is cross sections taken along lines A-A and B-B in FIG. 30.
Figure 31:
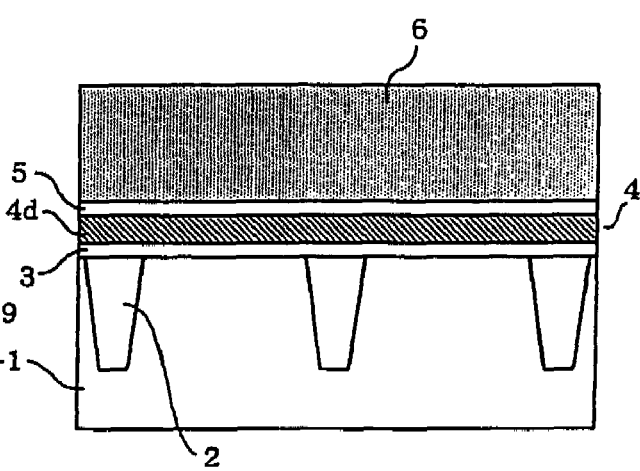
Figure 32:
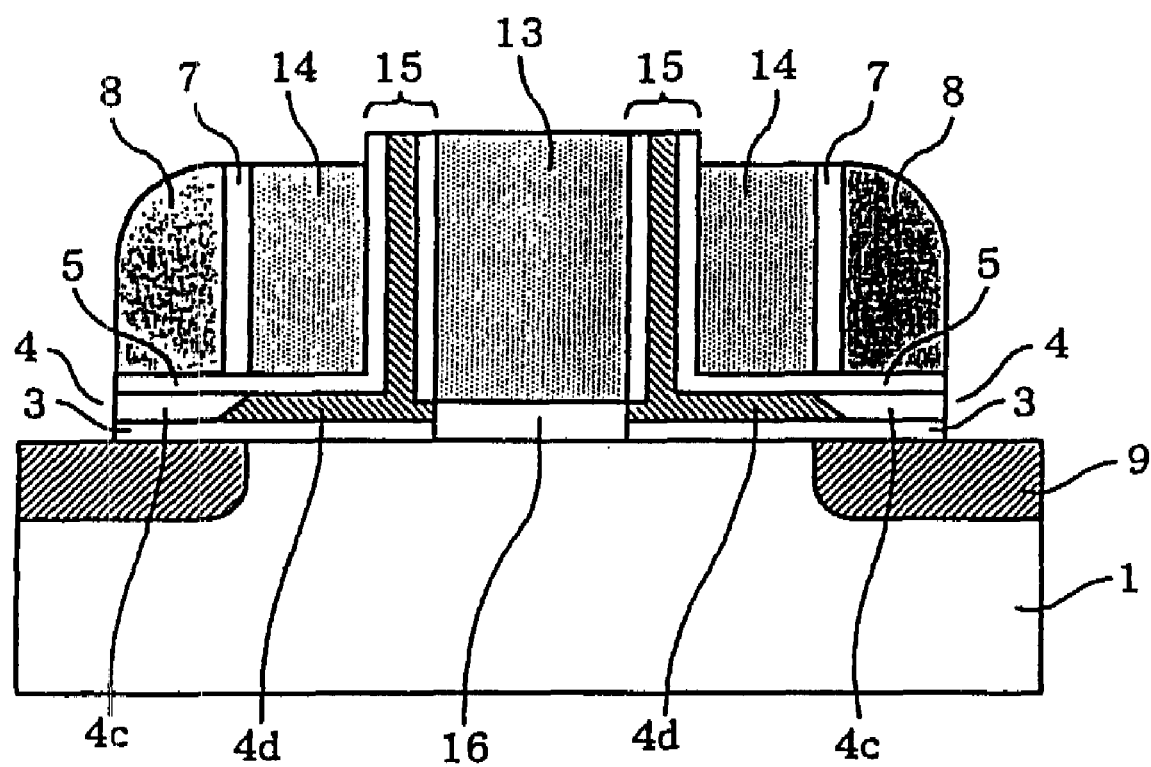
FIG. 32 is a cross section illustrating the structure of an example 7 in which the present invention is applied to a twin MONOS memory cell.

1 Silicon substrate
2 Element isolation insulating film
3 First gate insulating film
4 Charge accumulation layer
4a High trap surface-density region
4b Low trap surface-density region
4c Non-trap region
4d Initial film-thickness region
4e Thin-film region
5 Second gate insulating film
6 Gate conductor
6a Silicon film
7 Gate side wall
8 Side wall
9 Impurity diffusion layer
11 Distribution of electrons in writing by injecting CHE
13 Word gate
14 Control gate
15 Laminate insulating film
16 Gate insulating film
17 Defect generated at boundary

The invention claimed is:

1. A semiconductor device comprising: a plurality of non-volatile memory cells comprising a laminate insulating film and a first gate electrode formed on the laminate insulating film, the laminate insulating film including a first gate insulating film, a charge accumulation layer and a second gate insulating film that are formed on and in this order from a semiconductor substrate on which a source and a drain region are formed, wherein the laminate insulating film is projected outward from an end of the first gate electrode and the electric charge trap surface-density of the charge accumulation layer outside the end of the gate electrode is lower than that in the region inside the first gate electrode.

2. The semiconductor device according to claim 1, wherein, gate side walls are formed on both sides of the first gate electrode and the source and the drain region are formed so as to sandwich the first gate electrode.

3. The semiconductor device according to claim 1, wherein, a second gate electrode is formed adjacent to the first gate electrode or between a pair of the first gate electrodes through a gate insulating film without a charge accumulation layer over the semiconductor substrate and a gate side wall is formed on the side that is not adjacent to a gate electrode other than the first or the second gate electrode and the source and the drain region are formed so as to sandwich the first and the second gate electrode.

4. The semiconductor device according to claim 2, wherein, a side wall is formed outside the gate side wall and the laminate insulating film is formed so as to extend from under the first gate electrode to under the outer end of the side wall disposed on the first gate electrode through the gate side wall.

5. The semiconductor device according to claim 1, wherein, a charge accumulation layer with a low electric charge trap surface-density is a film in which a region equal in the number of traps per unit volume to a region inside the first gate electrode is smaller in thickness than the region inside the first gate electrode end or is fewer in the number of traps per unit volume than the region inside the gate electrode.

6. The semiconductor device according to claim 1, wherein, the charge accumulation layer at least partially comprises a region where an electric charge trap surface-density is continuously or stepwise decreased toward the outside of the first gate electrode.

7. The semiconductor device according to claim 6, wherein, the region where an electric charge trap surface-density is continuously or stepwise decreased is a region where the thickness of a region which is equal in the number of traps per unit volume to a region inside the first gate electrode is continuously or stepwise smaller or a region where the number of traps per unit volume is continuously or stepwise fewer.

8. The semiconductor device according to claim 1, wherein, a boundary between a charge accumulation layer low in an electric charge trap surface-density and a charge accumulation layer high in an electric charge trap surface-density is located at the end of the first gate electrode or under the gate side wall formed on the side of the first gate electrode.

9. The semiconductor device according to claim 6, wherein, a region where an electric charge trap surface-density in the charge accumulation layer is continuously or stepwise decreased is located under the gate side wall formed on the side of the first gate electrode.

10. The semiconductor device according to claim 1, wherein, the surface height of the second gate insulating film outside the end of the first gate electrode is higher than that of the second gate insulating film inside the first gate electrode.

11. The semiconductor device according to claim 1, wherein, a region lower in an electric charge trap surfacedensity in the charge accumulation layer than a region inside the first gate electrode has an electric charge trap surface-density of $10^{11}$ cm$^{-2}$ or less.

12. The semiconductor device according to claim 1, wherein, at least the charge accumulation layer immediately under the first gate electrode is formed of a nitride silicon film, silicon oxynitride film or high dielectric insulating film and the second gate insulating film is formed of a oxide silicon film or silicon oxynitride film.

13. The semiconductor device according to claim 2, wherein, the gate side wall is formed of a material that hardly transmits oxygen.

14. The semiconductor device according to claim 2, wherein, the gate side wall is formed of a single layer of a silicon nitride film or a laminate film containing silicon nitride film.

15. A semiconductor device comprising a plurality of nonvolatile memory cells comprising a first gate electrode and a laminate insulating film, the first gate electrode provided with a gate side wall formed on the side of the first gate electrode, and the laminate insulating film including an underlying oxide film formed of a silicon oxide film or silicon oxynitride film formed on a semiconductor substrate on which a source and a drain region are formed, an upper oxide film formed of a silicon oxide film or silicon oxynitride film formed under and in contact with the lower surface of the first gate electrode and a silicon nitride film formed between the underlying oxide film and the upper oxide film; wherein, the laminate insulating film is projected outward from an end of the first gate electrode and the silicon nitride film outside the end of the first gate electrode is thinner than a region inside the first gate electrode.

16. A semiconductor device comprising a plurality of nonvolatile memory cells comprising a first gate electrode and a laminate insulating film, the first gate electrode provided with a gate side wall formed on the side of the first gate electrode, and the laminate insulating film including an underlying oxide film formed of a silicon oxide film or silicon oxynitride film formed on a semiconductor substrate on which a source and a drain region are formed, an upper oxide film formed of a silicon oxide film or silicon oxynitride film formed under and in contact with the lower surface of the first gate electrode and a silicon nitride film formed between the underlying oxide film and the upper oxide film; wherein, the laminate insulating film is projected outward from an end of the first gate electrode and the silicon nitride film comprises a region where the thickness thereof is continuously or stepwise reduced outside the end of the first gate electrode.

17. A semiconductor device comprising a plurality of nonvolatile memory cells comprising a first gate electrode and a laminate insulating film, the first gate electrode provided with a gate side wall formed on the side of the first gate electrode, and the laminate insulating film including an underlying oxide film formed of a silicon oxide film or silicon oxynitride film formed on a semiconductor substrate on which a source and a drain region are formed, an upper oxide film formed of a silicon oxide film or silicon oxynitride film formed under and in contact with the lower surface of the first gate electrode and a silicon nitride film formed between the underlying oxide film and the upper oxide film; wherein, the laminate insulating film is projected outward from an end of the first gate electrode and the silicon nitride film does not exist outside the first gate electrode or the gate side wall.

18. A semiconductor device comprising a plurality of nonvolatile memory cells comprising a first gate electrode and a laminate insulating film, the first gate electrode provided with a gate side wall formed on the side of the first gate electrode, and the laminate insulating film including an underlying oxide film formed of a silicon oxide film or silicon oxynitride film formed on a semiconductor substrate on which a source and a drain region are formed, an upper oxide film formed of a silicon oxide film or silicon oxynitride film formed under and in contact with the lower surface of the first gate electrode and a silicon nitride film formed between the underlying oxide film and the upper oxide film; wherein, the laminate insulating film is projected outward from an end of the first gate electrode and the thickness of the upper oxide film outside the first gate electrode or the gate side wall is thicker than that of the upper oxide film immediately beneath the first gate electrode.

19. A method of producing a semiconductor device including a plurality of nonvolatile memory cells comprising a laminate insulating film and a first gate electrode formed on the laminate insulating film, the laminate insulating film including a first gate insulating film, a charge accumulation layer and a second gate insulating film which are formed on and in this order from a semiconductor substrate on which a source and a drain region are formed, the method comprising the steps of: forming the first gate insulating film on the semiconductor substrate; forming the charge accumulation layer on the first gate insulating film; forming the second gate insulating film on the charge accumulation layer; forming a silicon film on the second gate insulating film; forming the first gate electrode by patterning the silicon film; forming a gate side wall on the side of the first gate electrode; and changing a part of the charge accumulation layer outside the end of the first gate electrode to a film which is smaller in an electric charge trap surface-density than the original charge accumulation layer.

20. A method of producing a semiconductor device including a plurality of nonvolatile memory cells comprising a laminate insulating film and a first gate electrode formed on the laminate insulating film, the laminate insulating film including a first gate insulating film, a charge accumulation layer and a second gate insulating film which are formed on and in this order from a semiconductor substrate on which a source and a drain region are formed, the method comprising the steps of: forming the first gate insulating film on the semiconductor substrate; forming the charge accumulation layer on the first gate insulating film; forming the second gate insulating film on the charge accumulation layer; forming a silicon film on the second gate insulating film; forming the first gate electrode by patterning the silicon film; forming a gate side wall on the side of the first gate electrode; and changing a part of the charge accumulation layer exposed from the first gate electrode and the gate side wall and a part of a lower portion of the gate side wall to a film which is smaller in an electric charge trap density than the original charge accumulation layer.

21. A method of producing a semiconductor device including a plurality of nonvolatile memory cells comprising a laminate insulating film and a first gate electrode formed on the laminate insulating film, the laminate insulating film including a first gate insulating film, a charge accumulation layer and a second gate insulating film which are formed on and in this order from a semiconductor substrate on which a source and a drain region are formed, the method comprising the steps of: forming the first gate insulating film on the semiconductor substrate; forming the charge accumulation layer on the first gate insulating film; forming the second gate insulating film on the charge accumulation layer; forming a silicon film on the second gate insulating film; forming the first gate electrode by patterning the silicon film; and forming a gate side wall on the side of the first gate electrode; wherein a part of the charge accumulation layer exposed from the first gate electrode and the gate side wall and a part of a lower portion of the gate side wall are oxidized to be changed to an oxide silicon film or a high oxygen-content film.

22. The method of producing a semiconductor device according to claim 21, wherein, in the oxidation of a part of the charge accumulation layer exposed from the gate electrode and the gate side wall and a part of a lower portion of the gate side wall, the part of the charge accumulation layer exposed from the gate side wall is completely oxidized or the oxidation thereof is stopped short of the gate side wall.

23. A method of producing a semiconductor device including a plurality of nonvolatile memory cells comprising a laminate insulating film and a first gate electrode formed on the laminate insulating film, the laminate insulating film including a first gate insulating film, a charge accumulation layer and a second gate insulating film which are formed on and in this order from a semiconductor substrate on which a source and a drain region are formed, the method comprising the steps of: forming the first gate insulating film on the semiconductor substrate; forming the charge accumulation layer on the first gate insulating film; forming the second gate insulating film on the charge accumulation layer; forming a silicon film on the second gate insulating film; and forming the first gate electrode by patterning the silicon film; wherein, a part of the charge accumulation layer exposed from the first gate electrode is oxidized to change at least a part of it to an oxide silicon film and the side of the first gate electrode is oxidized to form a gate side wall at the same time.

24. The method of producing a semiconductor device according to claim 23, wherein, in the oxidation of the part of the charge accumulation layer exposed from the first gate electrode, the portion of the exposed charge accumulation layer is completely oxidized or the oxidation thereof is stopped short of the first gate electrode.

25. The method of producing a semiconductor device according to claim 21, wherein, the oxidation is performed in an atmosphere containing $O_2$, $H_2O$, NO, $N_2O$ or oxygen radical.

26. The method of producing a semiconductor device according to claim 23, wherein, the oxidation is performed in an atmosphere containing $O_7$, $H_2O$, NO, $N_2O$ or oxygen radical.

* * * * *